United States Patent
Li et al.

(10) Patent No.: US 10,777,382 B2
(45) Date of Patent: Sep. 15, 2020

(54) LOW VOLTAGE SCANNING ELECTRON MICROSCOPE AND METHOD FOR SPECIMEN OBSERVATION

(71) Applicant: Focus-eBeam Technology (Beijing) Co., Ltd., Beijing (CN)

(72) Inventors: Shuai Li, Beijing (CN); Wei He, Beijing (CN)

(73) Assignee: FOCUS-EBEAM TECHNOLOGY (BEIJING) CO., LTD., Beijing (CN)

( * ) Notice: Subject to any disclaimer, the term of this patent is extended or adjusted under 35 U.S.C. 154(b) by 397 days.

(21) Appl. No.: 15/757,333

(22) PCT Filed: Feb. 7, 2018

(86) PCT No.: PCT/CN2018/075564
§ 371 (c)(1),
(2) Date: Mar. 2, 2018

(87) PCT Pub. No.: WO2019/100600
PCT Pub. Date: May 31, 2019

(65) Prior Publication Data
US 2020/0234914 A1 Jul. 23, 2020

(30) Foreign Application Priority Data
Nov. 21, 2017 (CN) .......................... 2017 1 1168539

(51) Int. Cl.
*H01J 37/28* (2006.01)
*H01J 37/244* (2006.01)
(Continued)

(52) U.S. Cl.
CPC ............ *H01J 37/28* (2013.01); *H01J 37/145* (2013.01); *H01J 37/1475* (2013.01);
(Continued)

(58) Field of Classification Search
CPC ...... H01J 37/28; H01J 37/145; H01J 37/1475; H01J 37/1477; H01J 37/244;
(Continued)

(56) References Cited

U.S. PATENT DOCUMENTS

| 4,675,524 A | 6/1987 | Frosien |
|---|---|---|
| 4,785,176 A | 11/1988 | Frosien |

(Continued)

FOREIGN PATENT DOCUMENTS

| CN | 1042029 A | 5/1990 |
|---|---|---|
| CN | 1630926 A | 6/2005 |

(Continued)

OTHER PUBLICATIONS

International search report in international application No. PCT/CN2018/085300, dated Aug. 21, 2018.
(Continued)

*Primary Examiner* — Nicole M Ippolito
(74) *Attorney, Agent, or Firm* — Syncoda LLC; Feng Ma

(57) ABSTRACT

A low voltage scanning electron microscope is disclosed, which includes: an electron source configured to generate an electron beam; an electron beam accelerator configured to accelerate the electron beam; a compound objective lens configured to converge the electron beams accelerated by the electron beam accelerator; a deflection device arranged between the inner wall of the magnetic lens and the optical axis of the electron beam and configured to deflect the electron beam; a detection device comprising a first sub-detection device for receiving secondary and backscattered electrons from the specimen, a second sub-detection device for receiving backscattered electrons, and a control device for changing the trajectories of the secondary electrons and the backscattered electrons; an electrostatic lens comprising the second sub-detection device, a specimen stage, and a
(Continued)

control electrode for reducing the moving speed of the electron beam and changing the moving directions of the secondary and the backscattered electrons.

21 Claims, 17 Drawing Sheets

(51) Int. Cl.
*H01J 37/145* (2006.01)
*H01J 37/147* (2006.01)

(52) U.S. Cl.
CPC ........ *H01J 37/1477* (2013.01); *H01J 37/244* (2013.01); *H01J 2237/0473* (2013.01); *H01J 2237/1516* (2013.01); *H01J 2237/2448* (2013.01); *H01J 2237/24475* (2013.01); *H01J 2237/24495* (2013.01)

(58) Field of Classification Search
CPC ....... H01J 2237/0473; H01J 2237/1516; H01J 2237/24475; H01J 2237/2448; H01J 2237/24495
USPC .................. 250/306, 307, 309, 310, 311
See application file for complete search history.

(56) References Cited

U.S. PATENT DOCUMENTS

| | | | |
|---|---|---|---|
| 4,831,266 A | 5/1989 | Frosien |
| 4,926,054 A | 5/1990 | Frosien |
| 5,146,090 A | 9/1992 | Plies |
| 6,392,231 B1 | 5/2002 | Chen |
| 6,407,387 B1 | 6/2002 | Frosien |
| 6,498,345 B1 | 12/2002 | Weimer |
| 6,617,579 B2 | 9/2003 | Yonezawa |
| 6,642,520 B2 | 11/2003 | Kimura |
| 6,855,938 B2 | 2/2005 | Preikszas |
| 7,425,701 B2 | 9/2008 | Steigerwald |
| 7,705,302 B2 | 4/2010 | Aoki |
| 7,759,653 B2 | 7/2010 | Chen |
| 7,960,697 B2 | 6/2011 | Chen |
| 8,319,192 B2 | 11/2012 | Ren |
| 9,000,370 B2 | 4/2015 | Ren et al. |
| 9,029,766 B2 | 5/2015 | Morishita |
| 9,354,188 B2 | 5/2016 | Albiez |
| 9,362,086 B2 | 6/2016 | T ma et al. |
| 9,490,100 B2 | 11/2016 | Sytar et al. |
| 9,583,306 B2 | 2/2017 | Li |
| 9,767,986 B2 | 9/2017 | Brown et al. |
| 10,008,360 B2 | 6/2018 | Li et al. |
| 2004/0245465 A1 | 12/2004 | Steigerwald |
| 2014/0077079 A1 | 3/2014 | Hoque et al. |
| 2016/0064184 A1 | 3/2016 | Brown et al. |
| 2016/0172150 A1 | 6/2016 | Li |
| 2016/0217968 A1 | 7/2016 | Li et al. |
| 2017/0018394 A1 | 1/2017 | Sohda et al. |
| 2017/0271124 A1* | 9/2017 | Sasaki .................. H01J 37/244 |
| 2017/0329025 A1 | 11/2017 | Brown et al. |

FOREIGN PATENT DOCUMENTS

| | | |
|---|---|---|
| CN | 101388317 A | 3/2009 |
| CN | 101996839 A | 3/2011 |
| CN | 103839743 A | 6/2014 |
| CN | 104897700 A | 9/2015 |
| CN | 106575594 A | 4/2017 |
| CN | 106920723 A | 7/2017 |
| CN | 207425790 U | 5/2018 |
| CN | 108231511 A | 6/2018 |
| EP | 1435640 A2 | 7/2004 |
| JP | 2000164167 A | 6/2000 |
| JP | 5004318 B2 | 8/2012 |
| JP | 2015170518 A | 9/2015 |

OTHER PUBLICATIONS

Written opinion of the international search authority in international application No. PCT/CN2018/085300, dated Aug. 21, 2018.
International search report in international application No. PCT/CN2018/075564, dated Aug. 23, 2018.
Written opinion of the international search authority in international application No. PCT/CN2018/075564, dated Aug. 23, 2018.

* cited by examiner

LOW VOLTAGE SCANNING ELECTRON MICROSCOPE AND METHOD FOR SPECIMEN OBSERVATION

TECHNICAL FIELD

The present disclosure relates to the field of Scanning Electron Microscopes (SEM), and in particular to a low voltage scanning electron microscope system, as well as a method for specimen observation.

BACKGROUND

Scanning electron microscope is widely used to observe a specimen to get an image in the micrometer or nanometer dimension by detecting signal electrons generated by a primary beam focused on the specimen. Compared with high landing energy, scanning electron microscope with low landing energy (<3 keV) is more popular to observe a nonmetallic specimen such as biological or semi-conductive specimen, because it reduces the radiation damage of the primary beam and the electron charging effect on specimen surface.

At the low landing energy condition, the observed specimen is generally of non-conductive materials, the primary beam current is usually very small such as several hundred picoamperes, even several picoamperes to prevent excessive charging or damage on the specimen. Therefore, the signal electrons excited from specimen which is related to primary beam are very few. From this aspect, the detector needs to collect the emitted signal electrons as many as possible. Additionally, as the signal beam collection efficiency has an influence on the speed of image generation, i.e., the throughput of scanning electron microscope, increasing the collection efficiency of signal electrons is important to the low voltage scanning electron microscope.

On the other hand, signal electrons need to be detected separately. When the primary beam impinges on the specimen, secondary electrons (SEs) with energy of less than 50 eV and backscattered electrons (BSEs) with energy similar to the primary beam are generated. The SE signal reflects the topography information of specimen. The BSE signal mainly reflects information of the material of the specimen, because BSEs are related to the atomic number of observed material. Some BSEs emitted in a small angle with respect to the specimen surface are influenced by fluctuation of the specimen surface, and thus can also reflect the topography information of specimen. Especially for biology specimen which is dyeing by heavy metal, a single BSE image is easy to show the structure of the specimen. Collecting SEs and BSEs separately will help making a better contrast image to distinguish the structure of specimen.

At the low landing energy condition, for any one of the scanning electron microscopes, there is no solution to simultaneously meet the high resolution, the 100% or close to 100% collection efficiency, flexible detection of BSEs with different emitted angles and flexible control of reception of the required type of signal electrons.

SUMMARY

In view of this, embodiments according to the disclosure provide a low voltage scanning electron microscope system and a method for specimen observation to improve the collection efficiency of signal electrons and flexibly control reception of the required type of signal electrons, under the premise of maintaining high resolution of the low voltage scanning electron microscope.

An embodiment of the disclosure provides a low voltage scanning electron microscope system, comprising: an electron source, an electron beam accelerator, a deflection device, a detection device, a compound objective lens comprising a magnetic lens and an electrostatic lens, wherein, the electron source is configured to generate an electron beam;

the electron beam accelerator is configured to accelerate the electron beam;

the compound objective lens is configured to converge the electron beam accelerated by the electron beam accelerator;

the deflection device is arranged between an inner wall of the magnetic lens and an optical axis of the electron beam and is configured to deflect the electron beam accelerated by the electron beam accelerator;

the detection device comprises a first sub-detection device for receiving secondary electrons and backscattered electrons generated by applying the electron beam to impinge on a specimen, a second sub-detection device for receiving the backscattered electrons, and a control device for changing moving directions of the secondary electrons and the backscattered electrons; and the electrostatic lens comprises the second sub-detection device, a specimen stage, and a control electrode and is configured to reduce a moving speed of the electron beam and changing the moving directions of the secondary electrons and the backscattered electrons.

In an implementation, the electron beam accelerator is an anode.

In an implementation, the electron beam accelerator comprises an anode and a high voltage tube, the high voltage tube is connected to the anode and the second sub-detection device.

In an implementation, the system further comprises an electron beam adjustment device configured to change characteristics of the electron beam which has passed through the electron beam accelerator.

In an implementation, the electron beam adjustment device further comprises at least a convergence device and/or an aperture; wherein, the convergence device is configured to converge the electron beams accelerated by the electron beam accelerator;

the aperture is configured to filter the electron beam. and the center of the aperture is located on the optical axis.

In an implementation, the first sub-detection device is arranged between the anode and the magnetic lens, and is near the magnetic lens;

the second sub-detection device is arranged under the magnetic lens, and is to a pole piece of the magnetic lens.

In an implementation, the first sub-detection device is arranged between the anode and the magnetic lens, and is near the magnetic lens;

the second sub-detection device is arranged under the magnetic lens, and is connected to a lower end of the high voltage tube.

In an implementation, the control device comprises a multi-pole magnetic deflector and a multi-pole electrostatic deflector.

In an implementation, the magnetic lens is a magnetic immersion lens excited by a current coil, and the opening of a pole piece of the magnetic lens faces to the specimen.

In an implementation, a center hole diameter of the first sub-detection device is not more than 1 mm.

In an implementation, a center hole diameter of the second sub-detection device is smaller than a center hole diameter of the control electrode.

In an implementation, a potential on the electron source is V1, which is smaller than −5 kV, and a potential on the anode is 0 volt (V).

In an implementation, a potential on the second sub-detection device is equal to a grounding potential, a potential on the specimen stage is V2, which is greater than V1 and smaller than −5 kilo-volts (kV), and a potential on the control electrode is V3, which is adjustable and is smaller than or equal to 0 kV.

In an implementation, a potential on the electron source is V1, which is smaller than 0 kV, and both potentials on the anode and the high voltage tube are V4, which is greater than +5 kV.

In an implementation, a potential on the second sub-detection device is V4, a potential on the specimen stage is V2, which is greater than V1 and smaller than or equal to 0 kV, and a potential on the control electrode is V3, which is adjustable and is smaller than or equal to V4.

In an implementation, on the condition that he potential V3 on the control electrode is larger than the potential on the second sub-detection device and smaller than the potential V2 on the specimen stage, the first sub-detection device is configured to receive secondary electrons and receive backscattered electrons whose emitted angle with respect to a surface of the specimen is greater than a first threshold; and the second sub-detection device is configured to receive backscattered electrons whose emitted angle with respect to the surface of the specimen is smaller than the first threshold.

In an implementation, when the potential V3 on the control electrode is lower than the potential V2 on the specimen stage by at least 50V, the first sub-detection device is configured to receive only backscattered electrons whose emitted angle with respect to the surface of the specimen is greater than the first threshold; and the second sub-detection device is configured to receive only backscattered electrons whose emitted angle with respect to the specimen surface is less than the first threshold.

In an implementation, the system further comprises a signal processing device connected to at least one of the first or second sub-detection device, wherein the signal processing device is configured to perform at least one of the following:

process a first signal generated based on at least one of the secondary electrons or the backscattered electrons received by the first sub-detection device; or process a second signal generated based on the backscattered electrons received by the second sub-detection device.

In an implementation, the signal processing devices further comprise a signal amplification sub-device configured to amplify at least one of the first signal or the second signal; and a signal processing sub-device configured to process at least one of the amplified first signal or the second signal.

In an implementation, the signal processing device further comprises a signal synthesis sub-device configured to synthesize the first signal processed by the signal processing sub-device and the second signal processed by the signal processing sub-device to form a composite image.

An embodiment of the disclosure provides a method for specimen observation applied to the low voltage scanning electron microscope system, wherein the method comprises:

accelerating, by an electron beam accelerator, an electron beam generated by an electron source;

converging, by the compound objective lens, the electron beam accelerated by the electron beam accelerator, wherein the compound objective lens comprises a magnetic lens and an electrostatic lens;

decelerating, by the electrostatic lens, the converged electron beam; and deflecting, by the deflection device, the decelerated electron beam to impinge the electron beam on a specimen to generate secondary electrons and backscattered electrons; and changing moving directions of the secondary electrons and the backscattered electrons under an effect of the electrostatic lens and the control device, to be received by the detection device.

In an implementation, changing moving directions of the secondary electrons and the backscattered electrons under an effect of the electrostatic lens and the control device, to be received by the detection device comprises:

controlling a potential V3 on a control electrode of the electrostatic lens to be larger than a potential on a second sub-detection device of the electrostatic lens and smaller than a potential V2 on a specimen stage of the electrostatic lens;

receiving, by the first sub-detection device, the backscattered electrons whose emitted angle with respect to a surface of the specimen is greater than a first threshold and secondary electrons, under control of an electrostatic field and a magnetic field generated by the control device; and receiving, by the second sub-detection device, the backscattered electrons whose emitted angle with respect to the specimen surface is less than the first threshold.

In an implementation, when the potential V3 on the control electrode is lower than the potential V2 on the specimen stage by at least 50V, under the control of an electrostatic field and a magnetic field generated by the control device, the first sub-detection device detects the backscattered electrons whose emitted angle with respect to a surface of the specimen is greater than the first threshold; and the second sub-detection device detects the backscattered electrons whose emitted angle with respect to the surface of the specimen is less than the first threshold.

In an implementation, the method further comprises at least one the following:

processing the first signal generated by the first sub-detection device based on at least one of the detected secondary electrons or the detected backscattered electrons; or processing the second signal generated by the second sub-detection device based on the detected backscattered electrons.

In an implementation, the method further comprises:

amplifying at least one of the first signal or the second signal; and processing and outputting at least one of the amplified first signal or the second signal, to form at least one of a first image or a second image.

In an implementation, the method further comprises:

synthesizing the first image and the second image to form a composite image.

In the embodiment of the present disclosure, the landing energy of the primary electrons is less than 5 keV by controlling the potentials on the electron source, electron beam accelerator, the second sub-detection device, the control electrode and the specimen stage. The resolution of the scanning electron microscope system is improved by the compound objective lens composed of the electrostatic lens and the magnetic lens. The collection efficiency of the signal electrons is up to about 100% on the effect of the electrostatic lens and the control device. And the category of the signal electrons and the emitted angle of the backscattered electrons detected by detection device can be flexibly controlled by controlling the potential on the control electrode.

DETAILED DESCRIPTION

Figure 1:
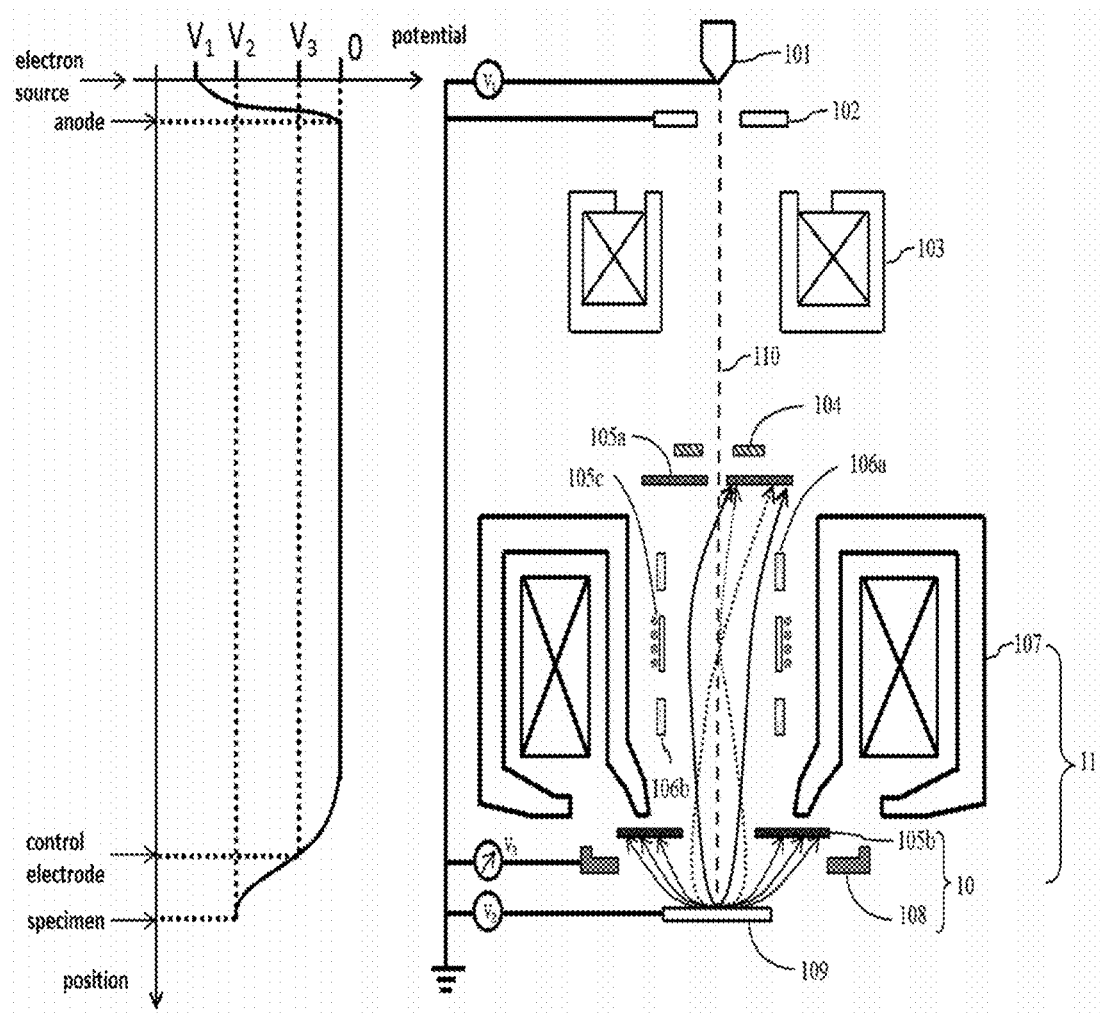
FIG. 1 is a diagram of a low voltage scanning electron microscope system according to Embodiment 1 of the disclosure.

The details are described as follows with reference to the figures and several embodiments. It should be understood that the specific embodiments described herein are merely used to explain the disclosure, and are not intended to limit the disclosure.

Before the disclosure is further described in detail, the terms involved in the embodiments of the disclosure are described. The terms involved in the embodiments of the disclosure are applicable to the following explanations.

1) Space charge effect. It is a phenomenon that in the electronic optical system the Coulomb forces between the electrons make the electron beam "expansion" and lead to increasing of the aberration of the electron beam imaging system. Especially when the electron beam forms a crossover, the density of the electron beam is very high in the crossover, so the distance between the electrons is small. Due to that the Coulomb's force is inversely proportional to the square of the distance between the electrons, a larger Coulomb force will cause the beam spot of the electron beam to expand.

2) The primary electron beam. The electron beam generated by the electron source and before reaching the specimen is referred to as the primary electron beam.

3) Signal electrons. The electrons emitted from the specimen when the primary electron beam impinges on the specimen is referred to as the signal electrons, including: secondary electrons and backscattered electrons.

4) Optical axis. It is the central axis of the electron beam.

5) Emitted angle. It refers to the angle between the emitting direction of the signal electrons and the specimen surface.

It should be noted that, in the diagrams of the disclosure, the trajectory of the signal electrons rotating along the optical axis under the action of the magnetic field is not marked, only the trajectory of the signal electrons on the meridian plane where the optical axis is located is indicated.

In the related art, the image aberrations of single magnetic or electrostatic objective lens increase significantly at the low landing energy condition. Compound electrostatic and magnetic objective lens having smaller aberrations at the low voltage is used to solve the problem because electrostatic objective lens can partially compensate the aberrations of pure magnetic lens, thereby increasing the resolution of scanning electron microscopy. In an alternative embodiment, the scanning electron microscope has a high voltage tube structure. The high voltage tube in the objective lens works as an electrode of the electrostatic lens, primary electron beam emitted from the electron source keeps a high speed in the high voltage tube and then is decelerated near the specimen under the influence of the electrostatic lens composed by the high voltage tube and the specimen. Another optional electrode between the high voltage tube and the specimen may be used as a middle electrode of the electrostatic lens. The magnetic field generated by the magnetic lens and the electrostatic field generated by the electrostatic lens are overlapping or conjoint. At the low landing energy condition, the compound objective lens comprised of the magnetic lens and the electrostatic lens can improve the resolution of the scanning electron microscope and thus improve the performance of the scanning electron microscope.

In the related art, in order to improve the resolution of the scanning electron microscope, a scanning electron microscope is provided. The compound electrostatic-magnetic lens is using one pole piece of objective lens as the electrode of electrostatic lens; the specimen is applied with a negative voltage, so as to form a retarding electrostatic field between the magnetic lens and the specimen, such that the primary beam emitted from the electron source is decelerated between the magnetic lens and the specimen. Another optional electrode between the high voltage tube and the specimen may be also used as a middle electrode of the electrostatic lens. The scanning electron microscope may have a detector or detective system above the magnetic objective lens called an in-column detector. Compared with the traditional out-column detector, the in-column detector does not occupy the space between the objective lens and the specimen. The working distance (WD) of the objective lens can be as small as possible, which is good to keep high resolution of the scanning electron microscope.

SEs are attracted by compound magnetic lens and electrostatic lens and accelerated by electrostatic lens, thus forming a crossover trajectory of SEs, and then pass through the objective lens and impinge on (and thus are collected by) the in-column detector. Because the energy of SEs is very low (<50 eV, topically <5 eV), almost all the SEs can be collected by detector except SEs passing through the center hole of detector. But some BSEs with lower emitted angle with respect to the specimen cannot be collected by the in-column detector due to that BSEs having high energy are not easily attract by the compound field of objective lens. These BSEs impinge on the inner surface of objective lens or emit to the outside of objective lens. So detection efficiency of the in-column detector for BSEs is low.

In the related art, to improve the detection efficiency of backscattered electrons, an alternative embodiment is also provided. A specialized BSE detector is added. The BSE detector is at the end of the high voltage tube to specimen and works as an electrode of electrostatic lens simultaneously. The BSE detector collects pure BSEs signal with a low emitted angle. And SEs with all emitted angle and BSEs with high emitted angle pass through the center hole of BSE detector and then are collected by an in-column detector above the objective lens. In the related art, there is also provided an alternative embodiment. A BSE detector is put in the high voltage tube to collect BSEs with a low emitted angle. SEs passing though the center hole of BSE detector is attracted and collected by an SE detector above the objective lens. Or the BSE detector is put in the magnetic objective lens and below the SE detector. The angles mentioned in the above related arts refer to the angle between the emitted direction of backscattered electrons and the specimen surface.

However, the above embodiments have at least the following disadvantages. At the low voltage scanning condition, if the throughput is most important for a given application, the BSE and SE detection efficiency should be as high as possible. In above embodiments, the backscattered electron emitted from the specimen beam is incident on the BSE detector outside the objective lens. At the low landing energy condition, the energy of BSEs is usually below 3 keV, so that the BSE signal on BSE detector is weak, and the gain of BSE detector is very low. Alternatively, when the BSEs are accelerated by the electrostatic field and incident on the BSE detector, part of SEs and BSEs escape from the center hole of the uppermost detector, reducing the BSE and SE detection efficiency. In addition, BSEs with different emitted angles carry different information of the specimens. The BSEs with a low angle according to the specimen show more topography contrast in detection image and BSEs with a large angle according to the specimen show more material contrast. For the low voltage scanning condition, at a given landing energy, the fields of electrostatic lens and magnetic lens are fixed, and the detectors' positions are fixed too. It is not possible to change the BSEs' trajectory to adjust BSE detector to collect the BSEs within a particular range of emitted angles.

In another alternative embodiment, the BSE detector has several circular detective channels to distinguish BSEs from different emitted angles. But the structure of BSE detector is complex and the flexibility to selectively catch BSEs with different emitted angles especially at different landing energies is still not good.

Embodiment 1

In view of the above problems, the embodiment 1 of the disclosure provides a low-voltage scanning electron microscope system. As shown in FIG. 3, the scanning electron microscope system includes an electron source 101, an electron beam accelerator, a compound objective lens 11 composed of a magnetic lens 107 and an electrostatic lens 10, a deflection device 106, and a detection device 105. The electron source 101 is configured to generate an electron beam; in an optional embodiment, the electron source is a field emission electron source such as a thermal field emission electron source or a cold field emission electron source. Compared with a thermionic emission electron source made of tungsten wire or $LaB_6$, the field emission electron source has higher current density and brightness, and has a smaller virtual source, so it can reduce the size of the beam spot focused on the specimen surface and improve the resolution of the scanning electron microscope system.

The electron beam accelerator is an anode 102 located under the electron source 101 in the electron beam emitting direction. It is configured to form an electrostatic field and accelerate the electron beam. In the related art, between the anode and electron source of a scanning electron microscope, at least an extracting electrode generally is included. In embodiment 1 of the present disclosure, the electron beam is emitted from the electron source 101 under the effect of the field formed by the anode and the electron source. Controlling the distance between the anode 102 and the emitter tip of the electron source 101 as small as possible can help to reduce the energy dispersion of the electron beam and further reduce the effect of the space charge effect on the electron beam emitted by the electron source 101. In embodiment 1 of the present disclosure, the electron beam is accelerated by the anode and maintains high energy before entering the focusing field of compound objective lens, which is useful to reduce the influence of the space charge effect on the electron beam emitted from the electron source 101.

In embodiment 1 of the present disclosure, the potential V1 on the electron source 101 is less than −5 kilo-volts (kV), and the typical value of V1 is −10 kV. The anode 102 is grounded and the potential on anode is zero. The electron beam emitted from the electron source 101 flows through the anode 102, and is accelerated.

The compound objective 11 comprises a magnetic lens 107 and an electrostatic lens 10, and is configured to converge the electron beams accelerated by the electron beam accelerator The deflection device 106 is located between the inner wall of the magnetic lens 107 and the optical axis 110 of the electron beam to change the moving direction of the electron beam before impinging on the specimen. The deflection device 106 includes at least a first deflector 106a and a second deflector 106b, and more deflectors may participate in deflecting the primary electrons. Each of the first deflector 106a and the second deflector 106b may be a magnetic deflector or an electrostatic deflector. The first deflector 106a and the second deflector 106b are located inside the magnetic lens and to the field of the magnetic lens, and they are used in conjunction with each other, helping to reduce the aberrations of the edge of the scanning field during the large scanning field. The first deflector 106a and the second deflector 106b are typically multi-pole magnetic deflectors or electrostatic deflectors, such as 4-pole, 8-pole, 12-pole, 16-pole, etc., and are capable of generating a scanning field of any deflection direction. In embodiment 1 of the present disclosure, since the potential on the elements between the anode 102 and the BSE detector 105b are zero, the electrostatic deflector is preferred; Compared with the magnetic deflector, the electrostatic deflector responds faster, it is helpful to achieve a higher scanning speed, and improve the imaging speed of the electron beam microscope.

The detection device 105 includes a first sub-detection device 105a for receiving the secondary electron and backscattered electrons generated by the primary electron beam impinging on the specimen, a second sub-detection device 105b for receiving the backscattered electrons, and a control device 105c for changing the moving direction of the secondary electrons and the backscattered electrons.

In an optional embodiment, the first sub-detection device 105a is an in-lens detector and is located above the magnetic lens 107. The second sub-detection device 105b is a BSE detector, which is located below the magnetic lens 107 and is ly attached to the pole piece of the magnetic lens 107.

The in-lens detector 105a and the BSE detector 105b are circular detectors with center holes, each of which may be a semiconductor detector, an avalanche detector or a detector composed of a scintillator and a light guide tube. The thickness of the BSE detector 105b is relatively thin and controlled to be less than 2 mm or even 1 mm to avoid excessive occupation of the space between the magnetic lens 107 and the specimen stage 109, and to ensure a small working distance between the objective lens and the specimen thus ensuring a higher resolution; the in-lens detector 105a has a center hole diameter $\Phi 2 \leq 1$ mm, in order to improve the reception efficiency of the signal electrons.

In an optional embodiment, the control device 105c is located below the first sub-detection device 105a and above the second sub-detection device 105b. The control device 105c is composed of an electrostatic deflector and a magnetic deflector, and the electrostatic deflector and the magnetic deflector generate a composite electromagnetic field. The magnitude and direction of the electrostatic field intensity and the magnitude and direction of the magnetic field intensity are both related to the speed of the primary electron beam. In a preferred embodiment, the function of the control device 105c may be implemented by a Wien filter.

The electrostatic deflector in the control device 105c generates an electrostatic field and the electrostatic field force acting on the primary electrons is:

$$Fe = qE \quad (1)$$

where q is the charge amount of charged particles and E is the electrostatic field intensity.

At the same time, the magnetic deflector in the control device 105c generates a magnetic field that is perpendicular to the electrostatic field intensity, the Lorentz force acting on the primary electrons is:

$$Fm = qv \times B \quad (2)$$

where B is the magnetic flux density and v is the charged particle velocity.

For the primary electron beam, besides the electrostatic field force Fe, there is also a magnetic field force in the opposite direction. The magnitudes of the electrostatic field force and magnetic field force are same, so that the primary electron beam is not deflected.

The Lorentz force is related to the moving direction of the electrons, and the electrostatic field force is independent of the moving direction of the electrons. Therefore, when the signal electrons generated by primary beam, before impinging on specimen, pass through the Wien filter, the incident direction of the signal electrons becomes opposite to the incident direction of the primary electrons. The Lorentz force Fm and the electrostatic field force Fe acting on the signal electrons become the same direction, so that the signal electrons are deflected to the direction of the electrostatic field force by the net force of both.

In an alternative embodiment, the electrostatic deflector in the Wien filter is a multi-pole structure comprising a plurality of electrostatic electrodes, and the magnetic deflector in the Wien filter is a multi-pole structure comprising a plurality of magnetic poles, for example, four poles, eight poles, twelve poles, sixteen poles, etc. In this way, it is possible to generate an electrostatic field and a magnetic field which are balanced in any direction of 360° rotation distribution along the optical axis, so that the signal electrons can be deflected in any direction along the optical axis by 360°.

In embodiment 1 of the present disclosure, the compound objective lens 11 includes a magnetic lens 107 and an electrostatic lens 10. The magnetic lens 107 is preferably a magnetic immersion lens excited by a current coil. The magnetic lens 107 includes an exciting coil wound by the wire and a magnetic shell. The opening of the magnetic lens 107 is the pole piece of the magnetic lens, the opening of the pole piece faces the specimen, and the specimen surface is located near the strongest point of the magnetic field in Z-direction of the magnetic lens 107. In the related art, the opening of the pole piece of the non-immersed magnetic lens faces the optical axis 110 of the electron beam, and the focusing field of the magnetic lens is far away from the specimen surface. Therefore, the imaging aberration of the immersion magnetic lens 107 in the embodiment 1 of the present disclosure is smaller than that of the non-immersion magnetic lens in the related art, and thus the resolution of the scanning electron microscope system is improved.

In the embodiment 1 of the present disclosure, the electrostatic lens 10 is composed of a second sub-detection device 105b, a specimen stage 109 and a control electrode 108.

In an optional embodiment, the second sub-detection device 105b is a BSE detector, which is located under the magnetic lens 107 and is ly attached to the pole piece of the magnetic lens 107. The control electrode 108 has a center hole, and the control electrode 108 is located between the second sub-detection device 105b and the specimen stage 109.

In an optional embodiment, the electrostatic lens 10 is a cathode lens for reducing the moving speed of the electron beam accelerated by the anode and controlling the movement trajectory of the signal electrons. The second sub-detection device 105b is grounded, that is, the potential on the sub-detection device 105b is zero. The voltage between the anode 102 and the BSE detector 105b is zero. The potential on the specimen stage 109 is V2, V1<V2<−5 kV. The specimen is placed on the specimen stage 109, and has the same or similar potential as the specimen stage 109. The potential on the control electrode 108 is adjustable, and the potential of the control electrode 108 is V3≤0 kV. By adjusting the potential on the control electrode 108, the distribution of the decelerating electrostatic field is adjusted to affect the focusing status of the primary electron beam and the trajectory of the signal electrons generated by the primary electron beam impinging on the specimen. Therefore, after being accelerated by the anode 102, the electron beam generated by the electron source 101 is decelerated and focused by the electrostatic lens 10 on the specimen surface. The specimen is placed on the specimen stage and can be a semi-conductive specimen, a conductive specimen, a non-conductive specimen, or the like. Meanwhile, the electrostatic lens 10 can compensate for partial aberrations of the magnetic lens 107, thereby improving the resolution of the scanning electron microscope.

In the embodiment 1 of the present disclosure, the signal electrons generated by the primary electron beam impinging on the specimen include secondary electrons and backscattered electrons. Under the magnetic field of the magnetic lens 107 and the electrostatic field of the electrostatic lens 10, the trajectories of the secondary electrons and the backscattered electrons are all affected. Under the magnetic field of the magnetic lens 107 and the electrostatic field of the electrostatic lens 10, the scattered backscattered electrons emitted in a straight line are affected by a force directing to the optical axis 110 (direction r) and the moving trajectories gradually become to the optical axis 110.

At specific landing energy condition, that is, the potential V2 on the specimen is determined, and when the potential V3 on the control electrode is a specific value, there is no crossover on the trajectories of the backscattered electrons from the specimen surface to the detection device. However, at very low landing energy (less than 50 eV), the energy of the backscattered electron is to that of the secondary electron; under the effect of the electromagnetic field, a crossover trajectory of backscattered electrons is formed and then passes through the hole of the BSE detector. The energy of secondary electron is too low (less than 50 eV), so that a crossover trajectory of secondary electrons is formed between the specimen and the BSE detector or near the BSE detector under strong effect of the electromagnetic field. When the center hole diameter Φ1 of the BSE detector is within a specific range, all the secondary electrons can pass through the center hole of the BSE detector. Even the secondary electrons emitted nearly in parallel to the surface of the specimen can pass through the center hole of the BSE detector under the effect of electromagnetic field. At the same time, backscattered electrons having a small emitted angle converge toward the optical axis 110 under the effect of a force directing the optical axis 110; When the field of the objective lens is appropriate, the backscattered electrons can be detected by the BSE detector 105b even if the emitted angle of the backscattered electrons is to zero. In addition, backscattered electrons having a large emitted angle, that is, backscattered electrons emitted near the optical axis 110, pass through the center hole of the BSE detector 105b and are detected by the in-lens detector 105a. The center hole Φ1 of the BSE detector 105b is set on the order of several mm. The signal electrons generated by the primary electron beam impinging on the specimen surface are accelerated by the electrostatic lens 10, deflected by the Wien filter 105c and then detected by the detector 105. A portion of the signal electrons is directly detected by 105b and the other portion is detected by 105a. The secondary electrons can pass completely through the center hole of the BSE detector 105b.

Figure 2:
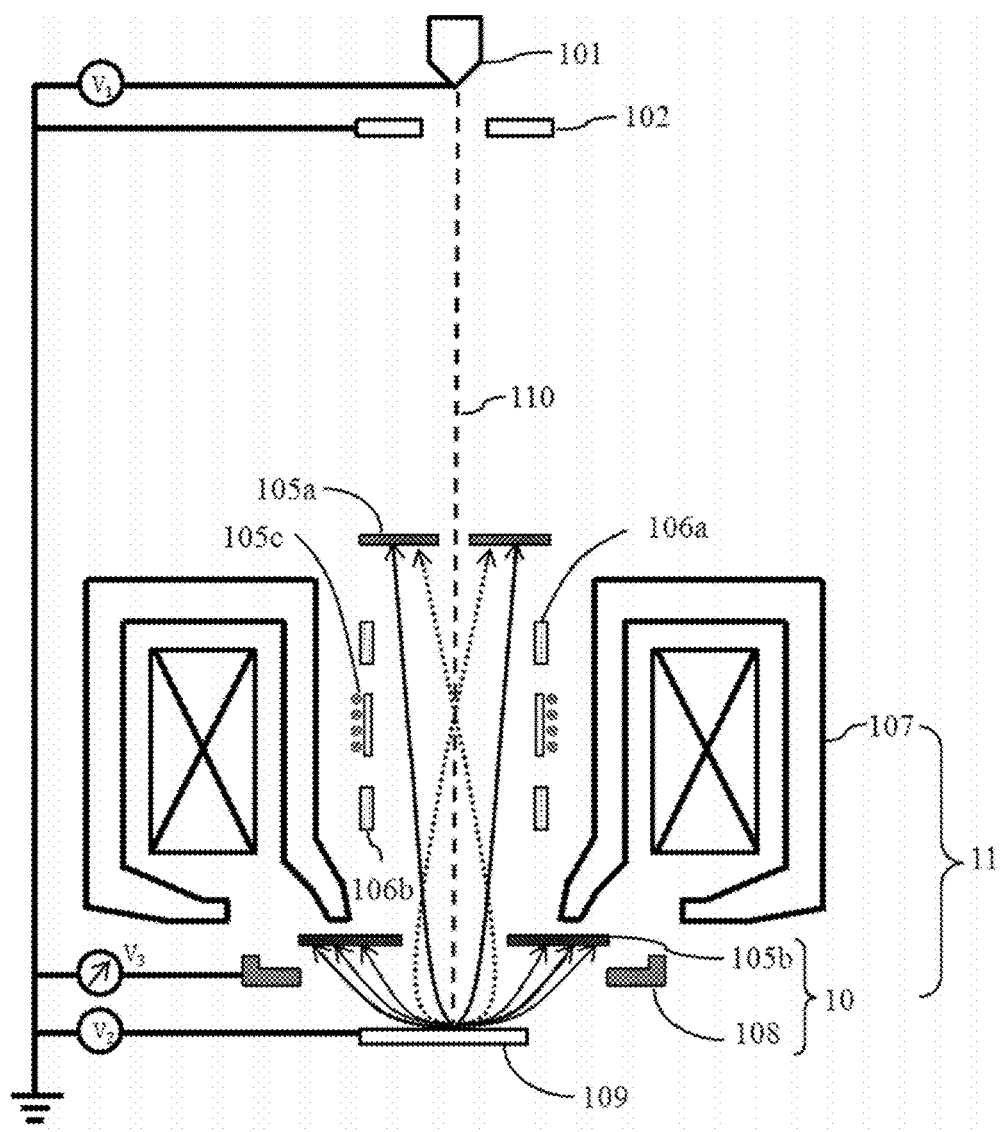
FIG. 2 is a diagram of receiving signal electrons by detection device according to Embodiment 1 of the disclosure.

Taking the Wien filter as an example, when the Wien filter 105c is off, as shown in FIG. 2, the signal electrons are accelerated by the electron lens 10. The backscattered electrons having a small emitted angle are completely detected by BSE detector 105b; In the case that the center hole of in-lens detector 105a is small, almost all of the secondary electrons and backscattered electrons having a large emitted angle can be detected by the in-lens detector 105a, and only a few secondary electrons pass through the center hole of the in-lens detector 105a and are not received by the detector 105.

In the embodiment 1 of the present disclosure, when the Wien filter 105c is on and generates appropriate electrostatic field and magnetic field, as shown in FIG. 1, the signal electrons are accelerated by the electron lens 10. The backscattered electrons having a small emitted angle are completely detected by BSE detector 105b; All of the secondary electrons and backscattered electrons having large emitted angle are detected by the in-lens detector 105a. Therefore, the detection efficiency of the detection device 105 is increased to about 100% with the assistance of the Wien filter 105c. On the one hand, the collection efficiency of the signal electrons directly decides the imaging speed of the scanning electron microscope system at low landing energy condition. On the other hand, specimens observed by a low voltage scanning electron microscope are usually poor conductors such as semiconductors and organic materials. The yield of signal electrons is much less than that of a good conductor. Therefore, collecting as many signal electrons as possible contributes to improving imaging speed of the scanning electron microscope. In addition, both the secondary electrons and backscattered electrons are affected by the additional accelerating field generated by the electrostatic lens 10, so that the energies of secondary electrons and backscattered electrons are increased by about V2 electron volts, resulting in higher signal gain in the detector, which helps to improve the imaging speed of the electron beam at the low landing energy condition.

Figure 3A:
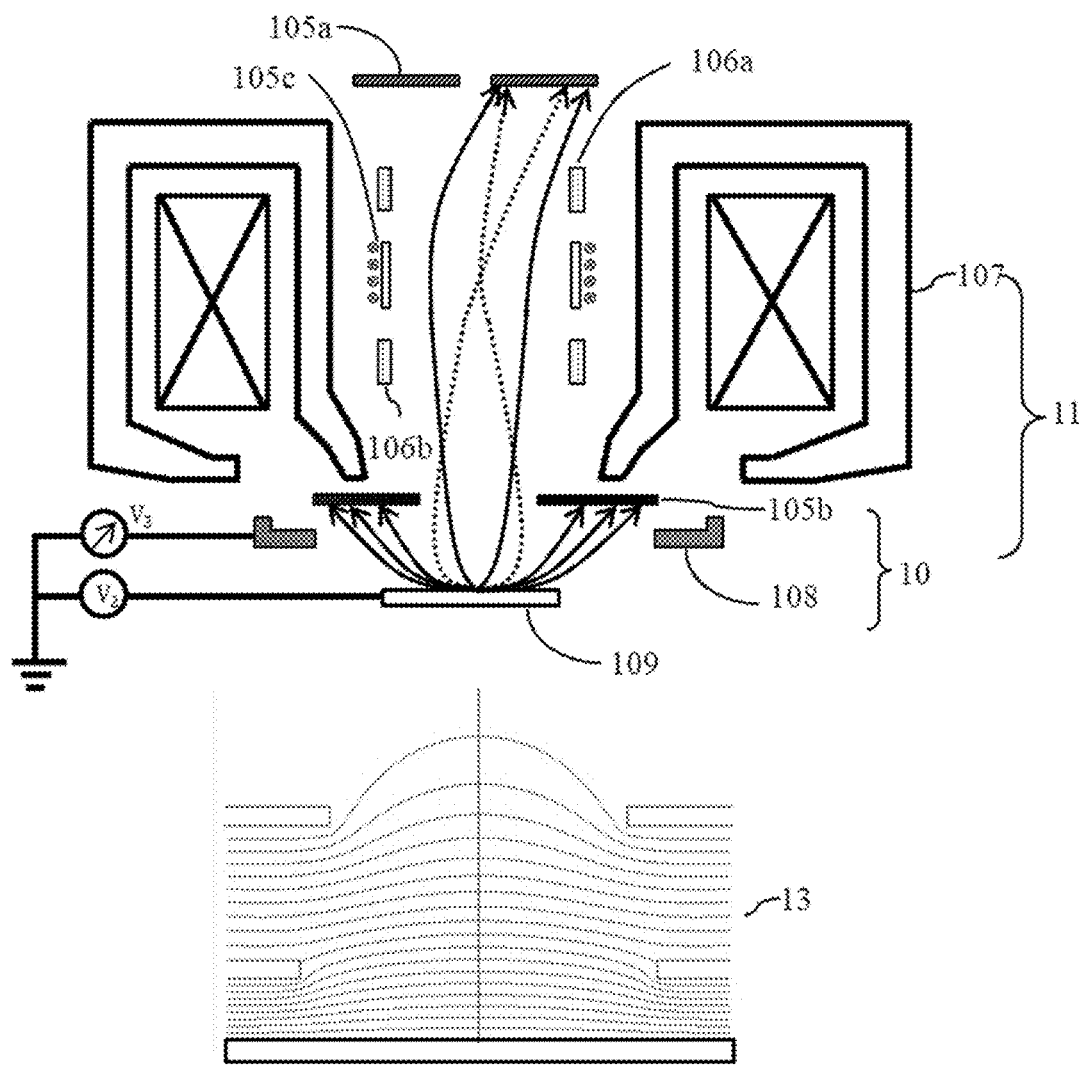
FIG. 3A is a diagram of a field of electrostatic lens according to Embodiment 1 of the disclosure.

The potential V3 on the control electrode 108 is adjustable as needed. The field of the electrostatic lens 10 can be flexibly adjusted by adjusting the potential on the control electrode 108, thereby controlling trajectories of backscattered electrons and secondary electrons. As shown in FIG. 3A, when the potential V3 on the control electrode 108 is adjusted to be between the potential on the BSE detector and the potential V2 on the specimen stage 109, an electrostatic field can be formed between the specimen stage 109 and the BSE detector 105b. The equipotential lines of the electrostatic field are as shown in FIG. 3A, labeled as 13. The electrostatic field of electrostatic lens and the magnetic field of the objective lens cooperatively acting on the signal electrons; At this time, secondary electrons form a crossover trajectory and pass through the BSE detector 105b, backscattered electrons having a large emitted angle also pass through the center hole of the BSE detector 105b, then the signal electrons passing through the BSE detector 105b are detected by the in-lens detector 105a under the effect of the Wien filter 105c. Backscattered electrons having a small emitted angle are detected by the BSE detector 105b under the effect of the electrostatic lens 10. Since the potential on the control electrode 108 can be continuously adjusted, it is possible to precisely control the backscattered electrons emitted in the specific angle range to be detected by the BSE detector 105b and the backscattered electrons having the larger emitted angle than the specific value to pass through the center hole of the BSE detector 105b and be detected by the in-lens detector 105a.

Backscattered electrons with different emitted angles carry different information of the specimen. The backscattered electrons with a low angle are subjected to fluctuations of the specimen surface and thus are able to show information of topography of the specimen. The backscattered electrons with a large angle (to 90°), that is, the backscattered electrons emitted near optical axis are able to show information of materials of the specimen. By adjusting the potential on the control electrode 108, it is possible to control the backscattered electrons whose emitted angle is within a specific value range to be detected by the detector 105b, so as to determine that the backscattered electron image obtained by the BSE detector 105b can be better to show the material information of the specimen, or can be better to show the topography information of the specimen. In addition, due to the difference of the specimen itself, the emitted angles of backscattered electrons generated by the primary electron beam impinging on the specimen are different from each other. The optimal backscattered electron image contrast can be obtained by flexible selection of backscattered electrons of different emitted angles. By controlling the potential on the electrode 108, the electrostatic field of the electrostatic lens in the compound objective lens 11 can be flexibly controlled, and the type and emitted angle of the signal electrons to be detected can be flexibly selected. Therefore, a BSE detector 105b can optionally detect backscattered electrons emitted from particular range angles. Compared with the BSE detector having several circular detective channels to distinguish backscattered electrons from different angles, the BSE detector 105b can be better adapted to selectively detect the backscattered electrons from different angles. At the same time, the complexity of the BSE detector 105b is reduced.

Figure 3B:
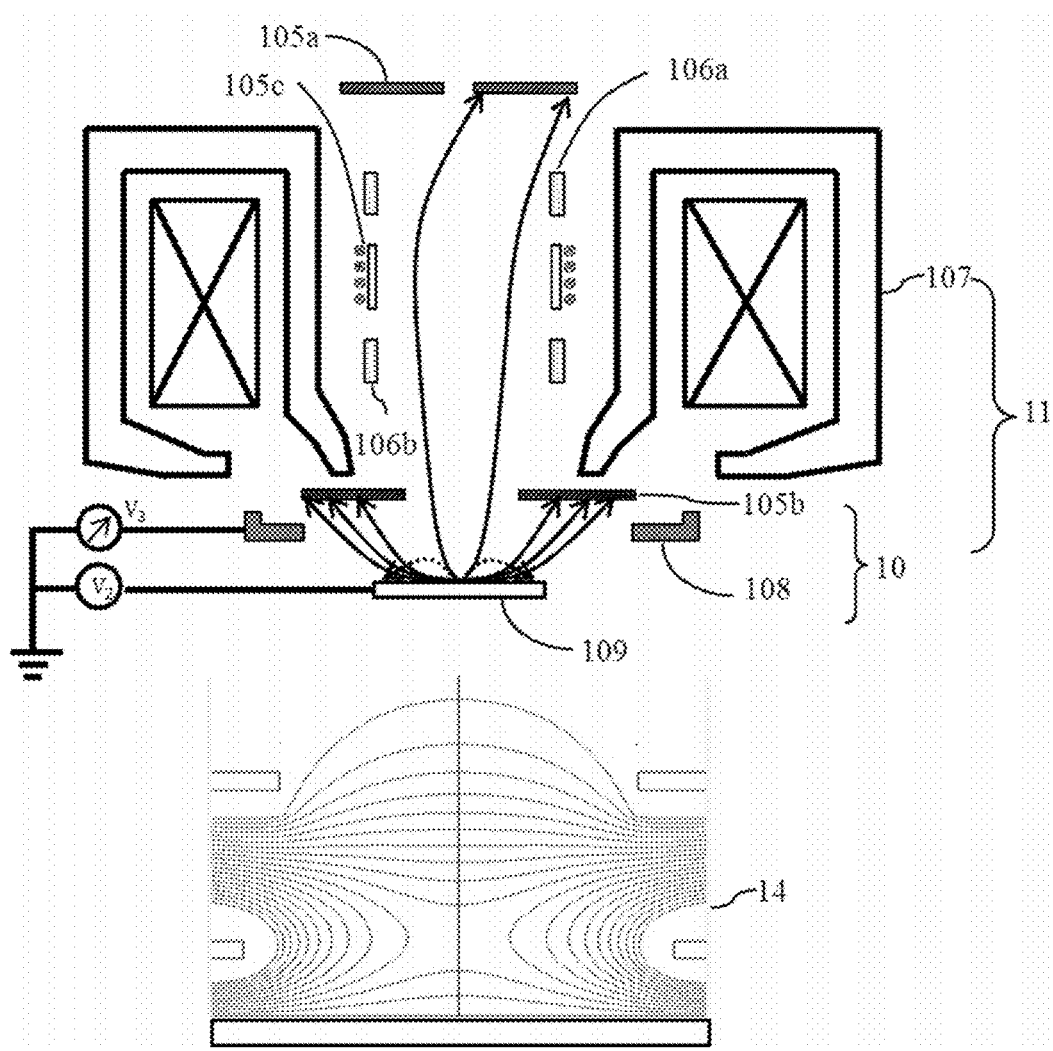
FIG. 3B is a diagram of a field of an electrostatic lens according to Embodiment 1 of the disclosure.

In the embodiment 1 of the present disclosure, when the potential V3 on the control electrode 108 is less than the potential V2 on the specimen stage 109 by at least 50V, the distribution of the electrostatic field is as shown in FIG. 3B. An electrostatic field is formed between the control electrode 108 and the specimen stage 109, and the electrostatic field forms a downward force on the electrons. The equipotential lines of the electrostatic field are shown in FIG. 3B, labeled as 14. The secondary electrons are suppressed by the downward electrostatic field force to return to the specimen. The backscattered electrons are affected by a force opposite to direction r. Therefore, the backscattered electrons with a low emitted angle can also be detected by the BSE detector 105b, and the backscattered electrons with a larger emitted angle are detected by the in-lens detector 105a. Secondary electrons are not detected. The in-lens detector 105a and the BSE detector 105b detect pure backscattered electrons of different emitted angles.

Therefore, by changing the potential on the control electrode 108, the electrostatic field of the electrostatic lens 10 can be flexibly controlled. It is also possible to flexibly select the type of the signal electrons detected by the in-lens detector 105a, and further to select to detect pure backscattered electrons or to detect the signal electrons including the backscattered electrons and the secondary electrons. Compared with the related art in which an adjustable filter is added in front of the in-lens detector for detecting pure backscattered electrons, the structure the embodiment 1 of the present disclosure reduces the complexity of the detection device.

In conclusion, by adjusting the potential of the control electrode 108, it is possible to selectively detect backscattered electrons at different emitted angles, pure backscattered electrons, or mixed backscattered electrons and secondary electrons, or pure secondary electrons, thereby improving the flexibility of detecting the signal electrons at the low landing energy condition.

It can be seen that in the embodiment 1 of the present disclosure, the electron beam generated by the electron source 101 is focused onto the specimen forming a focal spot or crossover. No other crossover is generated on the path between the electron source 101 and the specimen stage 109.

The electron beam maintains high energy in the path from the anode 102 to the field of compound objective lens; If the potential V1 on the electron source 101 is −10 kV, the primary electrons maintain the energy of 10 keV until they approach the field of the compound objective lens, and do not form other crossover, effectively reducing influence of the space charge effect on the system.

Embodiment 2

The low voltage scanning electron microscope system provided in the embodiment 2 of the present disclosure is similar to the scanning electron microscope system provided in the embodiment 1 of the present disclosure. The difference is that, in the embodiment 2 of the present disclosure, the scanning electron microscope system further comprises an electron beam adjusting device. The electron beam adjusting device is located under the anode 102 and is configured to change the characteristics of the electron beam passing through the anode 102. The characteristics of the electron beam include at least the electron beam density and the diameter of the electron beam.

Figure 4:
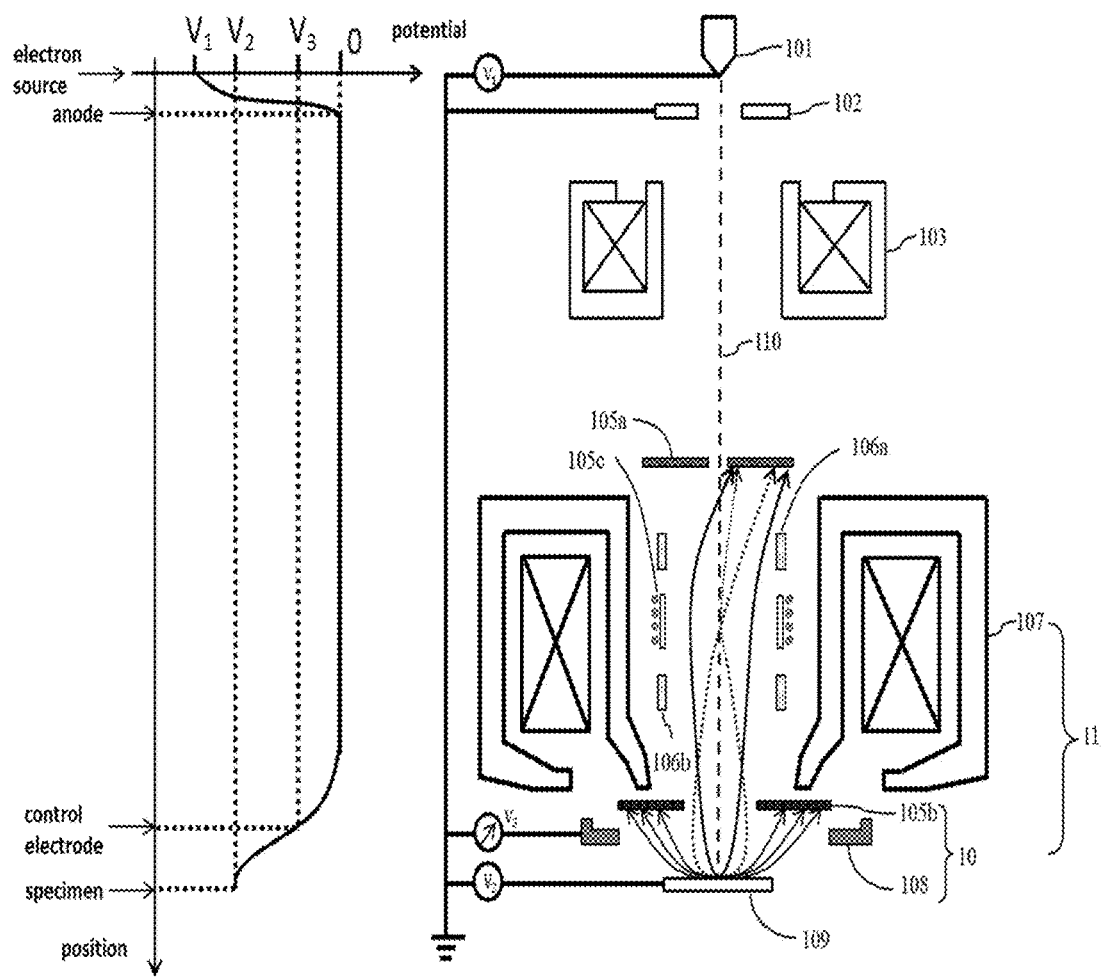
FIG. 4 is a diagram of a low voltage scanning electron microscope system according to Embodiment 2 of the disclosure.

In an optional embodiment, as shown in FIG. 4, the electron beam adjusting device is a convergence device 103 located under the anode 102 in the moving direction of the primary electron beam. The convergence device 103 is configured to converge the electron beam accelerated by the anode, that is, change the emitted angle of the electron beam to control density of the electron beam reaching the specimen. The electron beam does not form a crossover after passing through the convergence device 103.

In a preferred embodiment, the convergence device 103 is a magnetic lens excited by a current coil. The focusing magnetic field intensity of the convergence device 103 can be continuously adjusted.

Embodiment 3

Figure 5A:
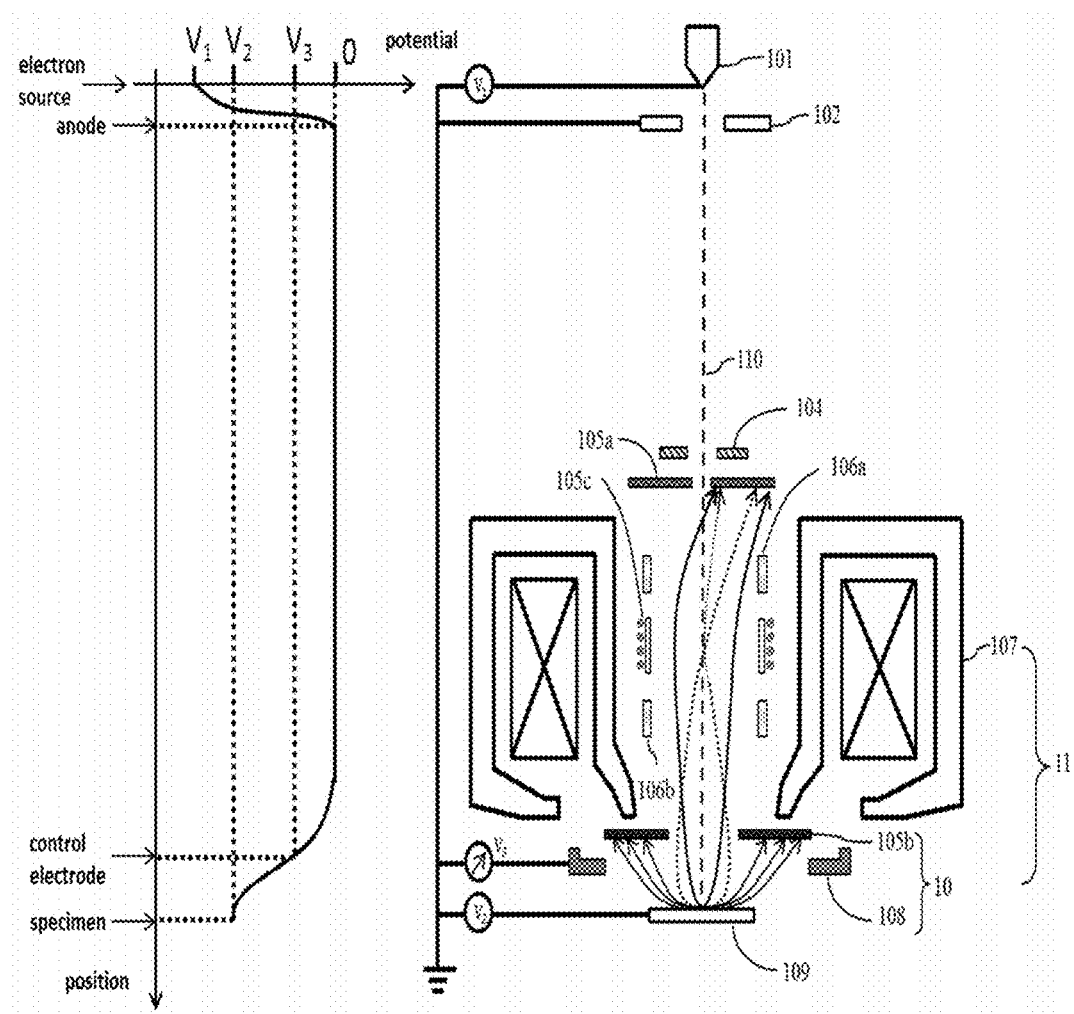
FIG. 5A is a diagram of a low voltage scanning electron microscope system according to Embodiment 3 of the disclosure.

The low voltage scanning electron microscope system provided in the embodiment 3 of the present disclosure is similar to the scanning electron microscope system provided in the embodiment 1 and 2 of the present disclosure. The difference is that, compared with the scanning electron microscope system provided in the embodiment 1, the scanning electron microscope system provided in the embodiment 3 further comprises an electron beam adjusting device. As shown in FIG. 5A, the electron beam adjusting device is an aperture 104 located under the anode 102 in the moving direction of the primary electron beam and is configured to filter the electron beam.

Figure 5B:
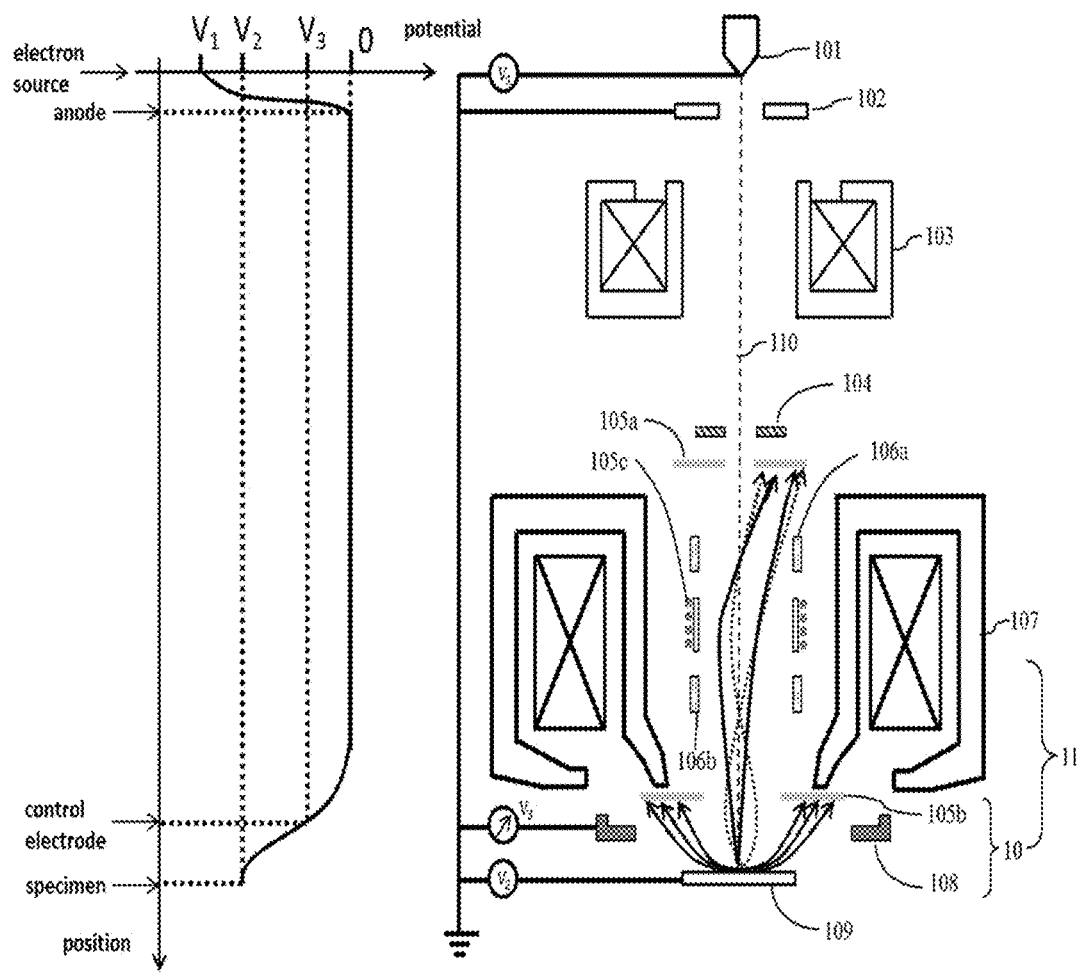
FIG. 5B is a diagram of a low voltage scanning electron microscope system according to Embodiment 3 of the disclosure.

Or as shown in FIG. 5b, compared with the scanning electron microscope system provided in the embodiment 2, the electron beam adjusting device provided in the embodiment 3 further comprises an aperture 104 located under the convergence device 103 in the moving direction of the primary electron beam and is configured to filter the electron beam.

The electron beam generated by the electron source 101 moves downward in the direction of the optical axis 110 after passing through anode 102, convergence device 103 and aperture 104.

Embodiment 4

Figure 6:
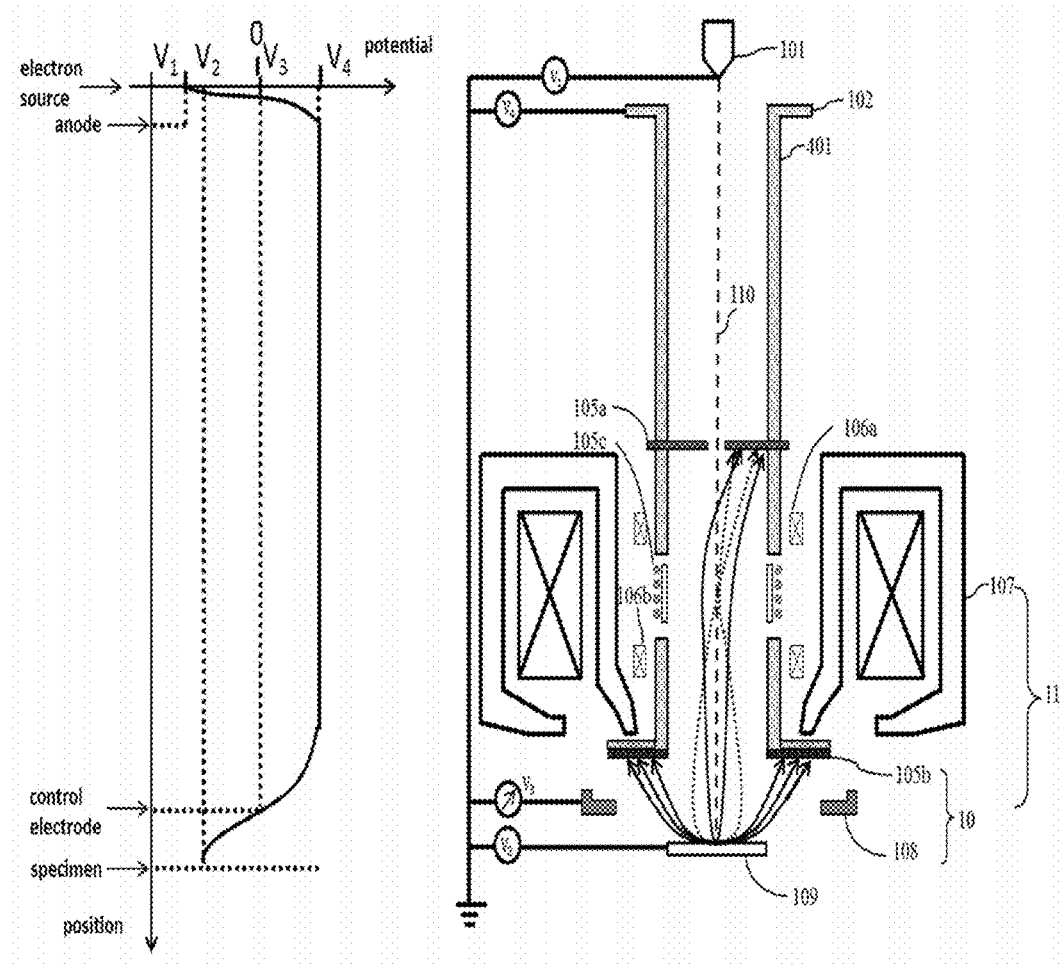
FIG. 6 is a diagram of a low voltage scanning electron microscope system according to Embodiment 4 of the disclosure.

The low voltage scanning electron microscope system provided in the embodiment 4 of the present disclosure is similar to the scanning electron microscope system provided in the embodiment 1 of the present disclosure. The difference is that, compared with the scanning electron microscope system provided in the embodiment 1, the electron beam accelerator of scanning electron microscope system provided in the embodiment 3 comprises an anode 102 and a high voltage tube 401 as shown in FIG. 6.

In the embodiment 4 of the present disclosure, the electron beam is kept at high energy in the high voltage tube located between the anode 102 and the BSE detector 105*b*, and a high voltage V4 is applied on the high voltage tube. Therefore, the deflection device 106 is preferably a magnetic deflector.

In the embodiment 4 of the present disclosure, electron beam accelerator is composed of an anode 102 and a high voltage tube 401. The high voltage tube 401 is connected to the anode 102 and the second sub-detection device 105*b* respectively. The potential V1 on the electron source 101 is less than 0 kV, and the potential on the anode 102 and the high voltage tube 401 are V4, V4>+5 kV. The electrostatic lens 10 is a cathode lens for reducing the moving speed of the electron beam accelerated by the anode and controlling the movement trajectory of the signal electrons. The potential on the second sub-detection device 105*b* is V4. The potential on the elements between the anode 102 and the BSE detector 105*b* are V4. The potential on the specimen stage 109 is V2, V1<V2≤0 kV. The specimen is placed on the specimen stage 109, and has the same or similar potential as the specimen stage 109. The potential on the control electrode 108 is adjustable, and the potential of the control electrode 108 is V3≤V4. By adjusting the potential on the control electrode 108, the distribution of the decelerating electrostatic field is adjusted to affect the focusing status of the primary electron beam and the trajectory of the signal electrons generated by the primary electron beam impinging on the specimen.

Figure 7:
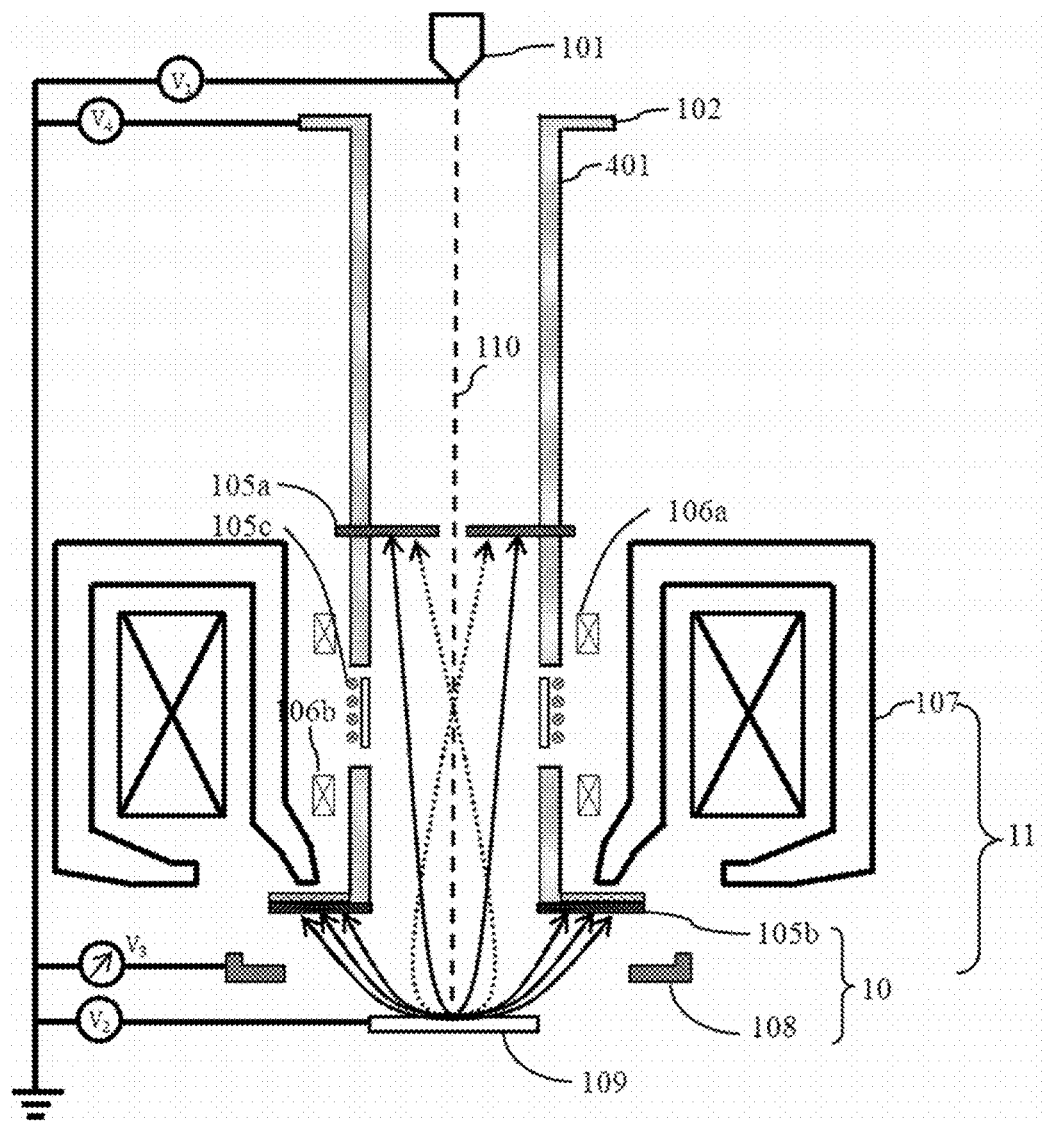
FIG. 7 is a diagram of receiving signal electrons by detection device according to Embodiment 4 of the disclosure.

Taking the Wien filter as an example, when the Wien filter 105*c* is off, as shown in FIG. 7, the signal electrons are accelerated by the electron lens 10. The backscattered electrons having a small emitted angle are completely detected by the BSE detector 105*b*; In the case that the center hole of in-lens detector 105*a* is small, almost all of the secondary electrons and backscattered electrons having a large emitted angle can be detected by the in-lens detector 105*a*, and only a few secondary electrons pass through the center hole of the in-lens detector 105*a* and are not received by the detector 105. When the Wien filter 105*c* is on and generates an appropriate electrostatic field and an appropriate magnetic field, as shown in FIG. 6, the signal electrons are accelerated by the electron lens 10. The backscattered electrons having a small emitted angle are completely detected by BSE detector 105*b*; all of the secondary electrons and backscattered electrons having a large emitted angle are detected by the in-lens detector 105*a*. So that the detection efficiency of the detection device 105 is increased to about 100% with the assistance of the Wien filter 105*c*. On the one hand, the collection efficiency of the signal electrons directly decides the imaging speed of the scanning electron microscope system at low landing energy condition. On the other hand, specimens observed by a low voltage scanning electron microscope are usually poor conductors such as semiconductors and organic materials.

The yield of signal electrons is much less than that of good conductor. Therefore, collecting as many signal electrons as possible contributes to improving the imaging speed of the scanning electron microscope. In addition, both the secondary electrons and backscattered electrons are affected by the accelerating field generated by the electrostatic lens 10, so that the energies of secondary electrons and backscattered electrons are increased by about V2 electron volts, resulting in a higher signal gain on the detector, which helps to improve the imaging speed of the electron beam at the low landing energy condition.

Figure 8A:
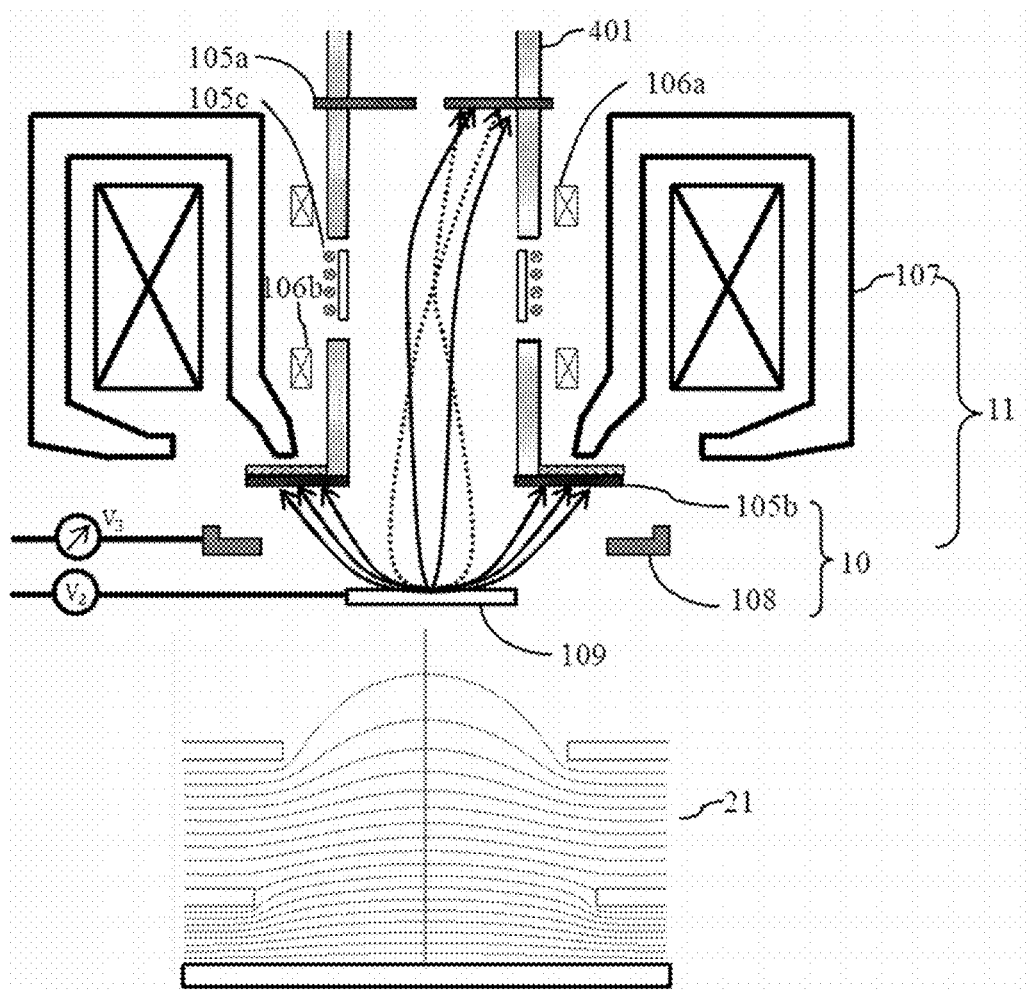
FIG. 8A is a diagram of a field of electrostatic lens according to Embodiment 4 of the disclosure.

The potential V3 on the control electrode 108 is adjustable as needed. The field of the electrostatic lens 10 can be flexibly adjusted by adjusting the potential on the control electrode 108, thereby controlling trajectories of backscattered electrons and secondary electrons. As shown in FIG. 8A, when the potential V3 on the control electrode 108 is adjusted to be between the potential V4 on the BSE detector and the potential V2 on the specimen stage 109, an electrostatic field can be formed between the specimen stage 109 and the BSE detector 105*b*. The equipotential lines of the electrostatic field are as shown in FIG. 8A, labeled as 21. The electrostatic field of electrostatic lens and the magnetic field of the objective lens cooperatively act on the signal electrons; At this time, the secondary electrons form a crossover trajectory and pass through the BSE detector 105*b*, the backscattered electrons having a large emitted angle also pass through the center hole of the BSE detector 105*b*, then the signal electrons passing through the BSE detector 105*b* are detected by the in-lens detector 105*a* under the effect of the Wien filter 105*c*. Backscattered electrons having a small emitted angle are detected by the BSE detector 105*b* under the effect of the electrostatic lens 10. Since the potential on the control electrode 108 can be continuously adjusted, it is possible to precisely control the backscattered electrons emitted in the specific angle range to be detected by the BSE detector 105*b* and the backscattered electrons having the larger emitted angle than the specific value to pass through the center hole of the BSE detector 105*b* and be detected by the in-lens detector 105*a*.

Backscattered electrons with different emitted angles carry different information of the specimen. The backscattered electrons with a low angle are subjected to fluctuations of the specimen surface and thus are able to show information of topography of the specimen. The backscattered electrons with a large angle (to 90°), that is, the backscattered electrons emitted near optical axis are able to show information of materials of the specimen. By adjusting the potential on the control electrode 108, it is possible to control the backscattered electrons whose emitted angle is within a specific value range to be detected by the detector 105*b*, so as to determine that the backscattered electron image obtained by the BSE detector 105*b* can be better to show the material information of the specimen, or can be better to show the topography information of the specimen. In addition, due to the difference of the specimen itself, the emitted angles of backscattered electrons generated by the primary electron beam impinging on the specimen are different from each other. The optimal backscattered electron image contrast can be obtained by flexible selection of backscattered electrons of different emitted angles. By controlling the potential on the electrode 108, the electrostatic field of the electrostatic lens in the compound objective lens 11 can be flexibly controlled, and the type and emitted angle of the signal electrons to be detected can be flexibly selected. Therefore, a BSE detector 105*b* can optionally detect backscattered electrons emitted from particular range angles. Compared with the BSE detector having several circular detective channels to distinguish backscattered electrons from different angles, the BSE detector 105*b* can be better adapted to selectively detect the backscattered electrons from different angles. At the same time, the complexity of the BSE detector 105*b* is reduced.

Figure 8B:
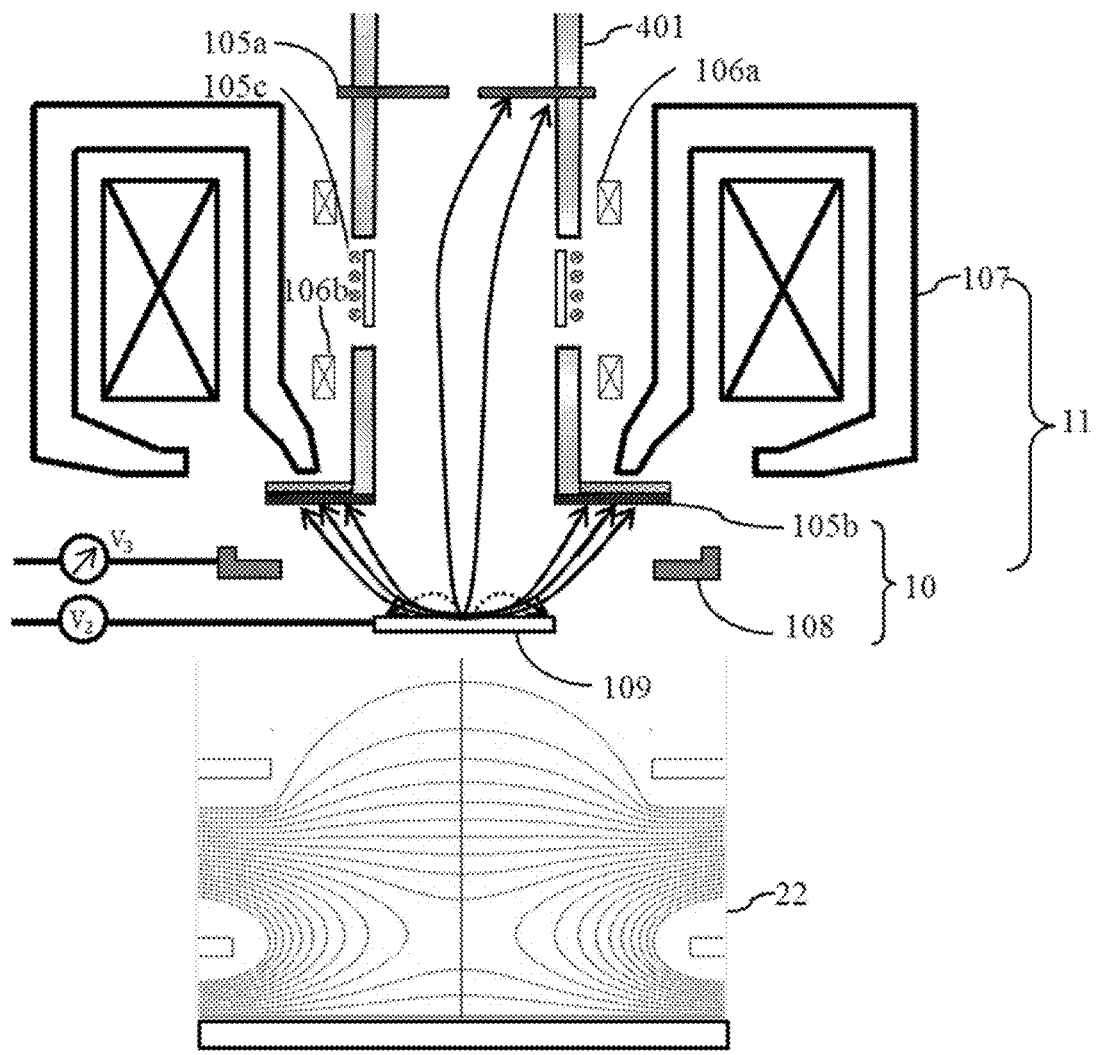
FIG. 8B is a diagram of a field of electrostatic lens according to Embodiment 4 of the disclosure.

In the embodiment 4 of the present disclosure, when the potential V3 on the control electrode 108 is less than the potential V2 on the specimen stage 109 by at least 50V, the distribution of the electrostatic field is as shown in FIG. 8B. An electrostatic field is formed between the control electrode 108 and the specimen stage 109, and the electrostatic field forms a downward force on the electrons. The equipotential lines of the electrostatic field are shown in FIG. 8B, labeled as 22. The secondary electrons are suppressed by the downward electrostatic field force to return to the specimen. The backscattered electrons are affected by a force opposite to direction r. Therefore, the backscattered electrons with a low emitted angle can also be detected by the BSE detector 105b, and the backscattered electrons with a larger emitted angle are detected by the in-lens detector 105a. Secondary electrons are not detected. The in-lens detector 105a and the BSE detector 105b detect pure backscattered electrons of different emitted angles.

Therefore, by changing the potential on the control electrode 108, the electrostatic field of the electrostatic lens 10 can be flexibly controlled. It is also possible to flexibly select the type of the signal electrons detected by the in-lens detector 105a, and further to select to detect pure backscattered electrons or to detect the signal electrons including the backscattered electrons and the secondary electrons. Compared with the related art in which an adjustable filter is added in front of the in-lens detector for detecting pure backscattered electrons, the structure the embodiment 1 of the present disclosure reduces the complexity of the detection device.

In conclusion, by adjusting the potential of the control electrode 108, it is possible to selectively detect backscattered electrons at different emitted angles, pure backscattered electrons, or mixed backscattered electrons and secondary electrons, or pure secondary electrons, thereby improving the flexibility of detecting the signal electrons at the low landing energy condition.

Embodiment 5

The low voltage scanning electron microscope system provided in the embodiment 5 of the present disclosure is similar to the scanning electron microscope system provided in the embodiment 4 of the present disclosure. The difference is that, in the embodiment 5 of the present disclosure, the scanning electron microscope system further comprises an electron beam adjusting device. The electron beam adjusting device is located under the anode 102, and is configured to change the characteristics of the electron beam passing through the anode 102. The characteristics of the electron beam include at least the electron beam density and the diameter of the electron beam.

Figure 9:
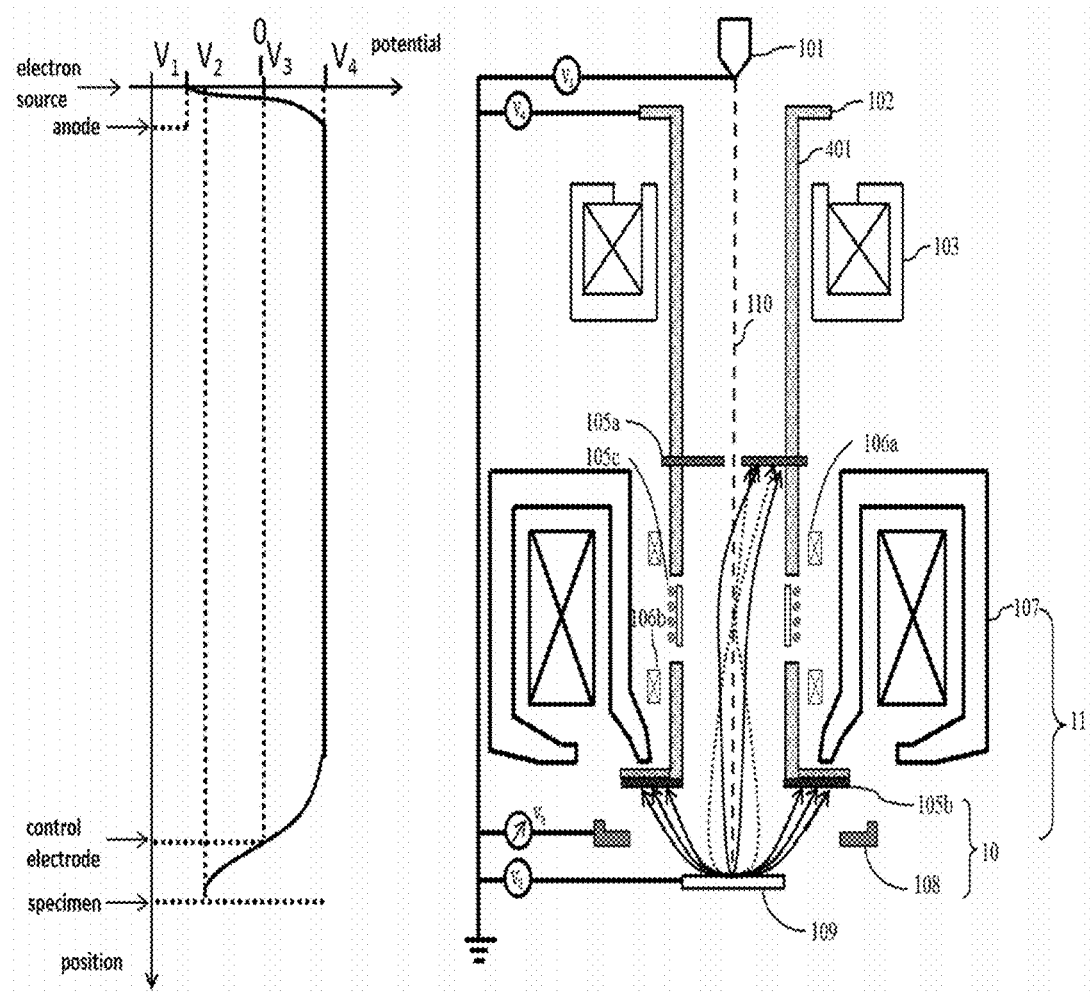
FIG. 9 is a diagram of a low voltage scanning electron microscope system according to Embodiment 5 of the disclosure.

In an optional embodiment, as shown in FIG. 9, the electron beam adjusting device is a convergence device 103 located under the anode 102 in the moving direction of the primary electron beam. The convergence device 103 is configured to converge the electron beam accelerated by the anode, that is, change the emitted angle of the electron beam to control density of the electron beam reaching the specimen. The electron beam does not form a crossover after passing through the convergence device 103.

In a preferred embodiment, the convergence device 103 is a magnetic lens excited by a current coil. The focusing magnetic field intensity of the convergence device 103 can be continuously adjusted.

Embodiment 6

Figure 10A:
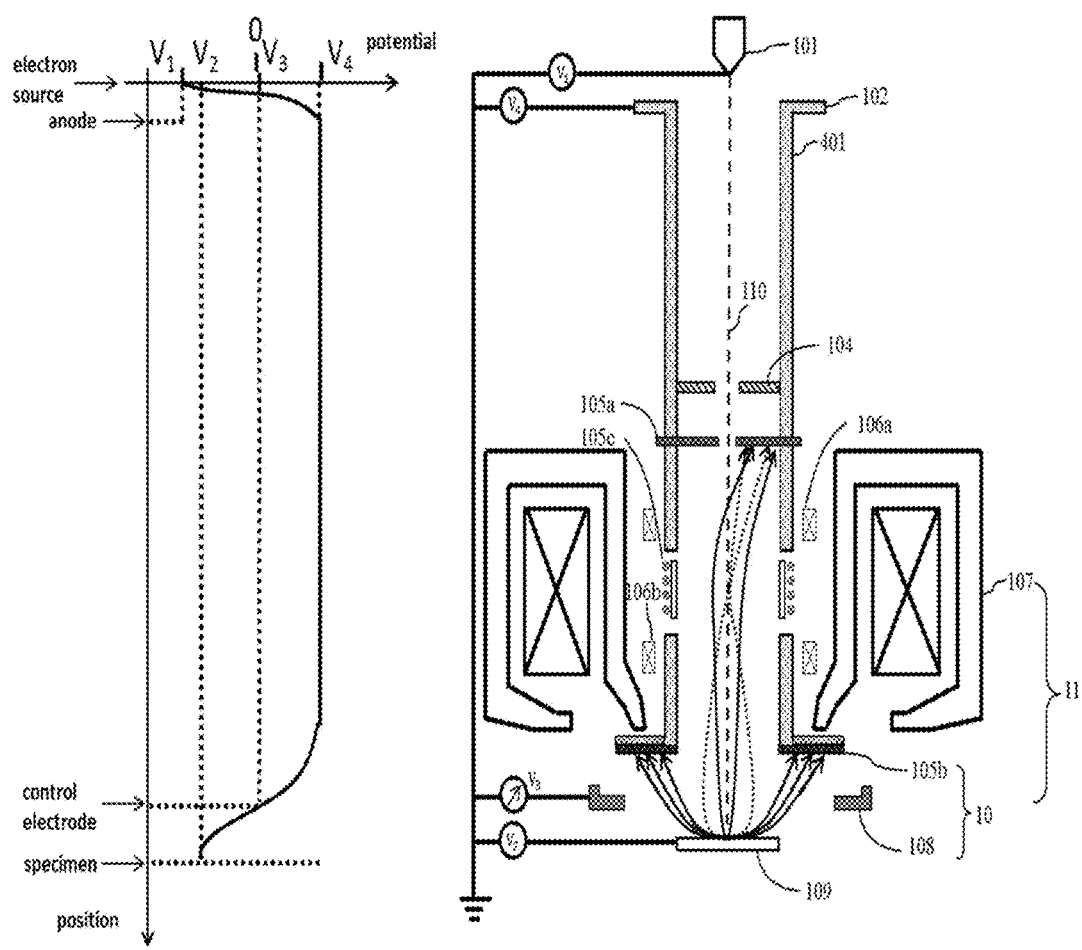
FIG. 10A is a diagram of a low voltage scanning electron microscope system according to Embodiment 6 of the disclosure.

The low voltage scanning electron microscope system provided in the embodiment 6 of the present disclosure is similar to the scanning electron microscope system provided in the embodiment 4 and 5 of the present disclosure. The difference is that, compared with the scanning electron microscope system provided in the embodiment 4, the scanning electron microscope system provided in the embodiment 6 further comprises an electron beam adjusting device. As shown in FIG. 10A, the electron beam adjusting device is an aperture 104 located under the anode 102 in the moving direction of the primary electron beam, and is configured to filter the electron beam passing through the anode 102.

Figure 10B:
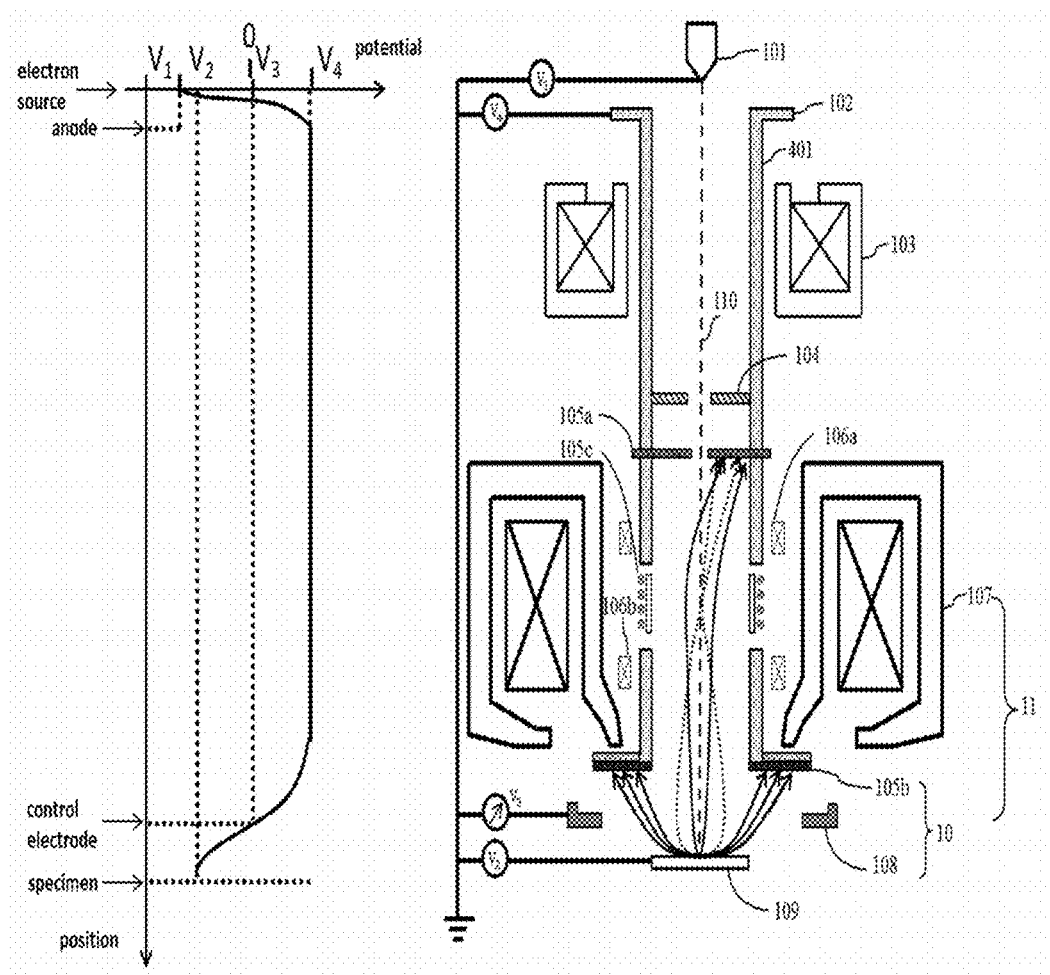
FIG. 10B is a diagram of a low voltage scanning electron microscope system according to Embodiment 6 of the disclosure.

Or, as shown in FIG. 10B, compared with the scanning electron microscope system provided in the embodiment 5, the electron beam adjusting device provided in the embodiment 6 further comprises an aperture 104 located under the convergence device 103 in the moving direction of the primary electron beam, and is configured to filter the electron beam passing through the convergence device 103. The electron beam generated by the electron source 101 moves downward in the direction of the optical axis 110 after passing through the anode 102, convergence device 103 and aperture 104.

Embodiment 7

Figure 11:
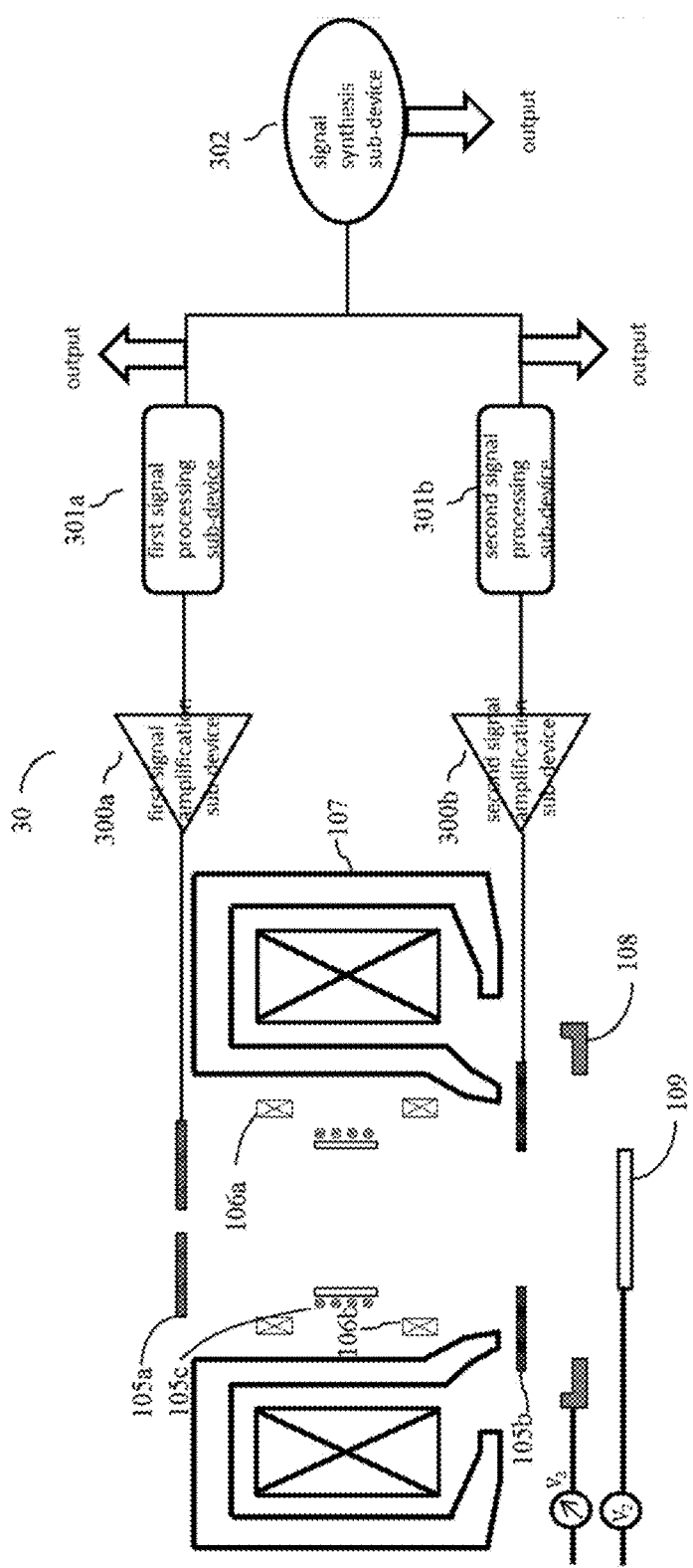
FIG. 11 is a diagram of a low voltage scanning electron microscope system according to Embodiment 7 of the disclosure.

Based on above the embodiment 1 to the embodiment 6, the low voltage scanning electron microscope system provided by the embodiment 7 of the present disclosure, as shown in FIG. 11, further comprises a signal processing device 30. The signal processing device 30 is connected to the first sub-detection device and/or the second sub-detection device. The signal processing device 30 is configured to process the first signal generated by the first sub-detection device based on the detected secondary electrons and/or backscattered electrons, and/or process the second signal generated by the second sub-detection device based on the detected backscattered electrons.

In an optional embodiment, the signal processing device includes a signal amplification sub-device and a signal processing sub-device.

The signal amplification sub-device comprises a first signal amplification sub-device 300a for amplifying the first signal, and/or a second signal amplification sub-device 300b for amplifying the second signal.

The signal processing sub-device comprises a first signal processing sub-device 301a for processing the amplified first signal and forming a first image, and/or a second signal processing sub-device 301b for processing the amplified second signal and forming a second image.

In an optional embodiment, the signal processing device further includes a signal synthesis sub-device. The signal synthesis sub-device is configured to synthesize the first signal processed by the first signal processing sub-device and the second signal processed by the second signal processing sub-device and form a composite image.

In the embodiment 7 of the present disclosure, the signal output by the first sub-detection device and the signal output by the second sub-detection device may be respectively amplified and processed to generate a secondary electron image and a backscattered electron image respectively. Or, the first signal output by the first sub-detection device and the second signal output by the second sub-detection device may be synthesized by the signal synthesis sub-device 302 into a composite image with a collection rate of 100% or to 100%.

Embodiment 8

Figure 12:
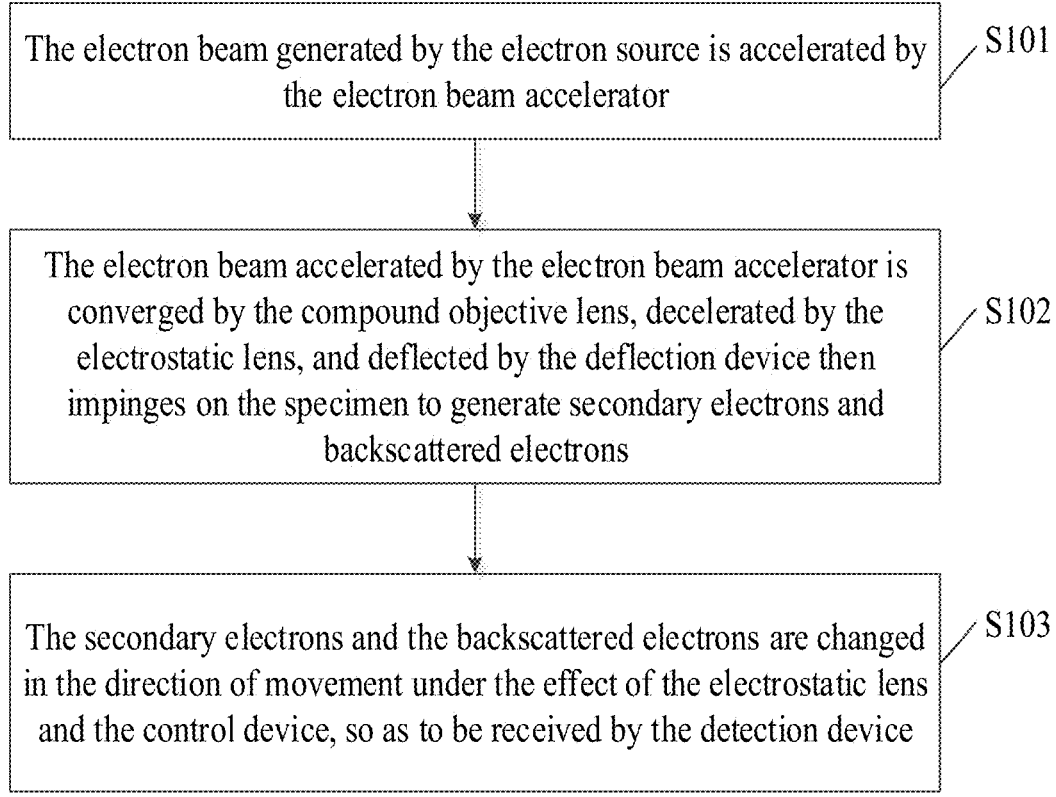
FIG. 12 is a flowchart of a method for specimen observation according to an embodiment 8 of the disclosure.

Based on the low voltage scanning electron microscope system described in the embodiment 1 to the embodiment 7, the embodiment 8 of the present disclosure further provides a method for specimen observation. The flowchart of a method for specimen observation, as shown in FIG. 12, includes the following steps:

In Step S101, the electron beam generated by the electron source is accelerated by the electron beam accelerator.

In an optional embodiment, the electron beam accelerator is an anode, the potential on the electron source is V1<−5 kV, and the potential on the anode is zero.

In another optional embodiment, the electron beam accelerator comprises an anode and a high voltage tube, the potential on the electron source is V1<0 kV, the potential on the anode is V4, V4>+5 kV, and the potential on the high voltage tube is also V4.

The electron beam generated by the electron source is accelerated by the electron beam accelerator and moves downward in the direction of the optical axis. The energy of the electron beam is maintained at more than 5 keV, typically 10 keV. Then the electron beam is converged by the convergence lens without forming a crossover, and passes through the aperture. The electron beam density and the diameter of the electron beam are adjusted by the convergence device and the aperture.

In Step S102, the electron beam accelerated by the electron beam accelerator is converged by the compound objective lens, decelerated by the electrostatic lens, and deflected by the deflection device, then impinges on the specimen to generate secondary electrons and backscattered electrons.

In a preferred embodiment, the electron beam with a high speed impinges on the specimen surface after being converged by the compound objective lens and decelerated by the electrostatic lens, and then is deflected by the deflection device to scan the specimen surface and generate secondary electrons and backscattered electrons. The compound objective lens includes a magnetic lens and an electrostatic lens. The magnetic lens is preferably a magnetic immersion lens excited by a current coil. The magnetic lens consists of an exciting coil wound by the wire and a magnetic shell. The opening of the magnetic lens is the pole piece of the magnetic lens, the opening of the pole piece faces the specimen, and the specimen surface is located near the strongest point of the magnetic field in the Z-direction of the magnetic lens. In the related art, the opening of the pole piece of the non-immersed magnetic lens faces the optical axis of the electron beam, and the focusing field of the magnetic lens is far away from the specimen surface. Therefore, the imaging aberration of the immersion magnetic lens in the embodiment of the present disclosure is smaller than that of the non-immersion magnetic lens in the related art, and the resolution of the scanning electron microscope system is improved.

In an optional embodiment, the potential on BSE detector included in the electrostatic lens is zero, the potential on the specimen stage is V2, V1<V2<−5 kV, the potential V3 on the control electrode is adjustable, V3≤0 kV, and the potential on the elements between the anode 102 and the BSE detector 105b are zero.

In another optional embodiment, the potential on BSE detector included in the electrostatic lens is V4, the potential on the specimen stage is V2, V1<V2≤0 kV; and the potential V3 on the control electrode is adjustable, V3≤V4.

The focusing magnetic field generated by the magnetic lens and the deceleration electrostatic field generated by the electrostatic lens form a compound focusing field. The magnetic lens and the electrostatic lens are included in the compound objective lens. High-energy electron beam moving downward in the direction of the optical axis is converged by the compound focusing field. The focused electron beam is decelerated to less than or equal to 5 keV by the deceleration electrostatic field, and then impinges on the specimen surface. The low-energy focused electron beam is deflected by the deflection device to scan the specimen surface and generate signal electrons including secondary electrons and backscattered electrons.

In Step S103, the secondary electrons and the backscattered electrons are changed the direction of movement under the effect of the electrostatic lens and the control device to be received by the detection device.

In an alternative embodiment, the detection device comprises a BSE detector and an in-lens detector. The signal electrons generated from the specimen are accelerated by the electrostatic field of the electrostatic lens. The potential V3 on the control device is continuously variable. When the potential V3 on the control device is adjusted between the potential on the BSE detector and potential on the specimen V2, the secondary electrons and the backscattered electrons whose emitted angle is larger than the first threshold value are detected by the in-lens detector, and the backscattered electrons whose emitted angle is less than the first threshold value are detected by the BSE detector. When the potential V3 on the control electrode is less than the potential V2 on specimen stage voltage by at least 50V, the secondary electrons are suppressed back to the specimen, and the backscattered electrons whose emitted angle is larger than the first threshold value are detected by the in-lens detector, and the backscattered electrons whose emitted angle is less than the first threshold value are detected by the BSE detector. Here, the first threshold value is related to the position of the BSE detector, and so on.

In an optional embodiment, when the control device is a Wien filter, the collection efficiency of in-lens detector for secondary electrons and/or backscattered electrons is improved by adjusting the electrostatic and magnetic fields generated by the Wien filter.

In conclusion, by adjusting the potential of the control electrode 108, it is possible to selectively detect backscattered electrons at different emitted angles, pure backscattered electrons, or mixed backscattered electrons and secondary electrons, or pure secondary electrons.

Embodiment 9

Figure 13:
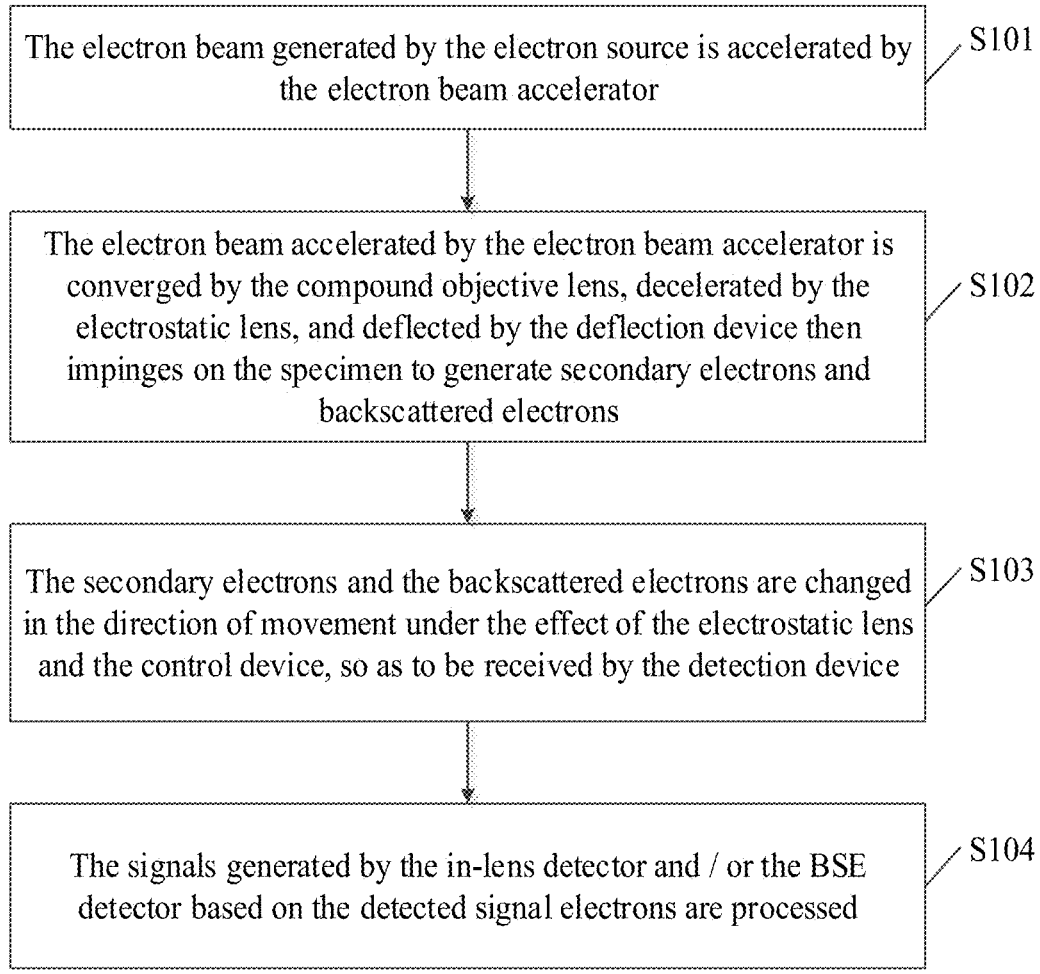
FIG. 13 is a flowchart of a method for specimen observation according to an embodiment 9 of the disclosure.

As shown in FIG. 13, the method for specimen observation provided in embodiment 9 of the present disclosure is similar to the method provided in embodiment 8, the difference is that the method further includes the following step after performing step S103:

Step S104, the signals generated by the in-lens detector and/or the BSE detector based on the detected signal electrons are processed.

In the embodiment of the present disclosure, the signals generated by the in-lens detector and the BSE detector are respectively amplified and processed to generate a secondary electron image and a backscattered electron image. Alternatively or additionally, the signal generated by BSE detector and the signal generated by the in-lens detector can be synthesized into a composite image with a collection rate of 100% or to 100%.

What described are merely embodiments of the disclosure, and not intended to limit the scope of protection of the disclosure. One of ordinary skill in the art will readily recognize that there would be variations to the embodiments and those variations would be within the spirit and scope of the present disclosure. Therefore, the protection scope of the present disclosure should be subject to the protection scope of the claims.

INDUSTRIAL APPLICABILITY

With the low voltage scanning electron microscope system, as well as the method for specimen observation according to the disclosure, the flexibility of detecting the signal electrons at the low landing energy condition is improved. Since the thickness of the BSE detector is relatively thin to avoid excessive occupation of the space between the magnetic lens and the specimen stage, a high resolution can be ensured. The center hole of the in-lens detector is relatively small, so that the detection efficiency of the signal electrons can be improved. And since the potential of the control electrode is adjustable as needed, by adjusting the potential of the control electrode 108, it is possible to selectively detect backscattered electrons at different emitted angles, pure backscattered electrons, or mixed backscattered electrons and secondary electrons, or pure secondary electrons. In addition, the appropriate electrostatic field and magnetic field generated by the Wien filter affect the trajectories of the signal electrons, helping to increase the collection efficiency of the detection device, which can help to improve the imaging speed of the low voltage scanning electron microscope.

What is claimed is:

1. A low voltage scanning electron microscope system, comprising: an electron source, an electron beam accelerator, a deflection device, a detection device, a compound objective lens comprising a magnetic lens and an electrostatic lens, wherein,
the electron source is configured to generate an electron beam;
the electron beam accelerator is configured to accelerate the electron beam;
the compound objective lens is configured to converge the electron beam accelerated by the electron beam accelerator;
the deflection device is arranged between an inner wall of the magnetic lens and an optical axis of the electron beam and is configured to deflect the electron beam accelerated by the electron beam accelerator;
the detection device comprises a first sub-detection device for receiving secondary electrons and backscattered electrons generated by applying the electron beam to impinge on a specimen, a second sub-detection device for receiving the backscattered electrons, and a control device for changing moving directions of the secondary electrons and the backscattered electrons; and
the electrostatic lens comprises the second sub-detection device, a specimen stage, and a control electrode and is configured to reduce a moving speed of the electron beam and changing the moving directions of the secondary electrons and the backscattered electrons.

2. The low voltage scanning electron microscope system according to claim 1, wherein the electron beam accelerator is an anode.

3. The low voltage scanning electron microscope system according to claim 2, wherein the first sub-detection device is arranged between the anode and the magnetic lens, and is near the magnetic lens; and
wherein the second sub-detection device is arranged under the magnetic lens, and is near a pole piece of the magnetic lens.

4. The low voltage scanning electron microscope system according to claim 2, wherein a potential on the electron source is V1, which is smaller than −5 kV, and a potential on the anode is 0 volt (V),
wherein a potential on the second sub-detection device is equal to a grounding potential, a potential on the specimen stage is V2, which is greater than V1 and smaller than −5 kilo-volts (kV), and a potential on the control electrode is V3, which is adjustable and is smaller than or equal to 0 kV.

5. The low voltage scanning electron microscope system according to claim 4, wherein on the condition that the potential V3 on the control electrode is larger than the potential on the second sub-detection device and smaller than the potential V2 on the specimen stage,
the first sub-detection device is configured to receive secondary electrons and receive backscattered electrons whose emitted angle with respect to a surface of the specimen is greater than a first threshold; and
the second sub-detection device is configured to receive backscattered electrons whose emitted angle with respect to the surface of the specimen is smaller than the first threshold.

6. The low voltage scanning electron microscope system according to claim 5, wherein when the potential V3 on the control electrode is lower than the potential V2 on the specimen stage by at least 50V,
the first sub-detection device is configured to receive only backscattered electrons whose emitted angle with respect to the surface of the specimen is greater than the first threshold; and
the second sub-detection device is configured to receive only backscattered electrons whose emitted angle with respect to the specimen surface is less than the first threshold.

7. The low voltage scanning electron microscope system according to claim 1, wherein the electron beam accelerator comprises an anode and a high voltage tube, the high voltage tube is connected to the anode and the second sub-detection device.

8. The low voltage scanning electron microscope system according to claim 7, wherein the first sub-detection device is arranged between the anode and the magnetic lens, and is near the magnetic lens; and
wherein the second sub-detection device is arranged under the magnetic lens, and is connected to a lower end of the high voltage tube.

9. The low voltage scanning electron microscope system according to claim 7, wherein a potential on the electron source is V1, which is smaller than 0 kV, and both potentials on the anode and the high voltage tube are V4, which is greater than +5 kV,
wherein a potential on the second sub-detection device is V4, a potential on the specimen stage is V2, which is greater than V1 and smaller than or equal to 0 kV, and a potential on the control electrode is V3, which is adjustable and is smaller than or equal to V4.

10. The low voltage scanning electron microscope system according to claim 9, wherein on the condition that the potential V3 on the control electrode is larger than the potential on the second sub-detection device and smaller than the potential V2 on the specimen stage,
the first sub-detection device is configured to receive secondary electrons and receive backscattered electrons whose emitted angle with respect to a surface of the specimen is greater than a first threshold; and the second sub-detection device is configured to receive backscattered electrons whose emitted angle with respect to the surface of the specimen is smaller than the first threshold.

11. The low voltage scanning electron microscope system according to claim 1, wherein the system further comprises an electron beam adjustment device configured to change characteristics of the electron beam which has passed through the electron beam accelerator.

12. The low voltage scanning electron microscope system according to claim 11, wherein the electron beam adjustment device further comprises at least one of a convergence device or an aperture; wherein,
the convergence device is configured to converge the electron beam accelerated by the electron beam accelerator; and
the aperture is configured to filter the electron beam, wherein a center of the aperture is located on the optical axis.

13. The low voltage scanning electron microscope system according to claim 1, wherein the control device comprises a multi-pole magnetic deflector and a multi-pole electrostatic deflector.

14. The low voltage scanning electron microscope system according to claim 1, wherein the magnetic lens is a magnetic immersion lens excited by a current coil, and an opening of a pole piece of the magnetic lens faces to the specimen.

15. The low voltage scanning electron microscope system according to claim 1, wherein a center hole diameter of the first sub-detection device is not more than 1 mm.

16. The low voltage scanning electron microscope system according to claim 1, wherein a center hole diameter of the second sub-detection device is smaller than a center hole diameter of the control electrode.

17. The low voltage scanning electron microscope system according to claim 1, wherein the system further comprises a signal processing device connected to at least one of the first or second sub-detection device, wherein
the signal processing device is configured to perform at least one of the following:
process a first signal generated based on at least one of the secondary electrons or the backscattered electrons received by the first sub-detection device; or
process a second signal generated based on the backscattered electrons received by the second sub-detection device.

18. The low voltage scanning electron microscope system according to claim 17, wherein the signal processing device further comprises:
a signal amplification sub-device configured to amplify at least one of the first signal or the second signal; and
a signal processing sub-device configured to process at least one of the amplified first signal or the second signal,
wherein the signal processing device further comprises a signal synthesis sub-device configured to synthesize the first signal processed by the signal processing sub-device and the second signal processed by the signal processing sub-device to form a composite image.

19. A specimen observation method, applied to the low voltage scanning electron microscope system, wherein the method comprises:
accelerating, by an electron beam accelerator, an electron beam generated by an electron source;
converging, by the compound objective lens, the electron beam accelerated by the electron beam accelerator, wherein the compound objective lens comprises a magnetic lens and an electrostatic lens;
decelerating, by the electrostatic lens, the converged electron beam; and
deflecting, by the deflection device, the decelerated electron beam to impinge the electron beam on a specimen to generate secondary electrons and backscattered electrons; and
changing moving directions of the secondary electrons and the backscattered electrons under an effect of the electrostatic lens and the control device, to be received by the detection device,
wherein changing moving directions of the secondary electrons and the backscattered electrons under an effect of the electrostatic lens and the control device, to be received by the detection device comprises:
controlling a potential V3 on a control electrode of the electrostatic lens to be larger than a potential on a second sub-detection device of the electrostatic lens and smaller than a potential V2 on a specimen stage of the electrostatic lens;
receiving, by the first sub-detection device, the backscattered electrons whose emitted angle with respect to a surface of the specimen is greater than a first threshold and secondary electrons, under control of an electrostatic field and a magnetic field generated by the control device; and
receiving, by the second sub-detection device, the backscattered electrons whose emitted angle with respect to the specimen surface is less than the first threshold.

20. The method according to claim 19, when the potential V3 on the control electrode is lower than the potential V2 on the specimen stage by at least 50V,
under the control of an electrostatic field and a magnetic field generated by the control device, the first sub-detection device detects the backscattered electrons whose emitted angle with respect to a surface of the specimen is greater than the first threshold; and
the second sub-detection device detects the backscattered electrons whose emitted angle with respect to the surface of the specimen is less than the first threshold.

21. The method according to claim 19, wherein the method further comprises at least one the following:
processing the first signal generated by the first sub-detection device based on at least one of the detected secondary electrons or the detected backscattered electrons; or
processing the second signal generated by the second sub-detection device based on the detected backscattered electrons,
wherein the method further comprises:
amplifying at least one of the first signal or the second signal;
processing and outputting at least one of the amplified first signal or the second signal, to form at least one of a first image or a second image; and
synthesizing the first image and the second image to form a composite image.

* * * * *